(12) United States Patent
Takakuwa et al.

(10) Patent No.: US 8,765,332 B2
(45) Date of Patent: Jul. 1, 2014

(54) GREEN CURABLE COMPOSITION, COLOR FILTER AND METHOD OF PRODUCING SAME

(75) Inventors: Hideki Takakuwa, Shizuoka-ken (JP); Kazuto Shimada, Shizuoka-ken (JP); Toru Fujimori, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 275 days.

(21) Appl. No.: 12/406,122

(22) Filed: Mar. 18, 2009

(65) Prior Publication Data

US 2009/0246649 A1 Oct. 1, 2009

(30) Foreign Application Priority Data

Mar. 28, 2008 (JP) ................. 2008-087557

(51) Int. Cl.
*G02B 5/20* (2006.01)
*G03F 7/00* (2006.01)

(52) U.S. Cl.
USPC ........................................ 430/7; 430/287.1

(58) Field of Classification Search
None
See application file for complete search history.

(56) References Cited

U.S. PATENT DOCUMENTS

| | | | | |
|---|---|---|---|---|
| 2008/0170187 A1* | 7/2008 | Shimizu et al. | ............... | 349/106 |
| 2010/0323284 A1* | 12/2010 | Nakashima et al. | ............... | 430/7 |

FOREIGN PATENT DOCUMENTS

| | | | |
|---|---|---|---|
| EP | 0 780 731 A2 | * | 6/1997 |
| EP | 0881541 A1 | | 12/1998 |
| EP | 2036957 A | | 3/2009 |
| GB | 2339571 | | 2/2000 |
| GB | 2340494 | | 2/2000 |
| JP | 2-199403 | | 8/1990 |
| JP | 10-160928 A | * | 6/1998 |
| JP | 2000-066385 | | 3/2000 |
| JP | 2000-080068 | | 3/2000 |
| JP | 2000-095992 A | * | 4/2000 |
| JP | 2004-046047 | | 2/2004 |
| JP | 2005-055585 A | | 3/2005 |
| JP | 2006-162784 A | * | 6/2006 |
| JP | 2006-317893 | | 11/2006 |
| JP | 2007-034119 A | * | 2/2007 |
| JP | 2007-041076 A | * | 2/2007 |
| JP | 2007-271727 | | 10/2007 |
| JP | 2008-165020 A | * | 7/2008 |
| TW | 200639582 | | 11/2006 |
| TW | 200732837 | | 9/2007 |
| WO | 2008081996 A | | 7/2008 |

OTHER PUBLICATIONS

Computer-generated translation of JP 2006-162784 (Jun. 2006).*
Computer-generated translation of JP 2000-095992 (Apr. 2000).*
Computer-generated translation of JP 10-160928 (Jun. 1998).*
Computer-generated translation of JP 2008-165020 [presented in two parts] (Jul. 2008).*
Computer-generated translation of JP 2007-041076 (Feb. 2007).*
Computer-generated translation of JP 2007-034119, part 1 of 2 (Feb. 2007).*
Computer-generated translation of JP 2007-034119, part 2 of 2 (Feb. 2007).*
English language translation of the following: Office action dated Feb. 28, 2013 from the European Patent Office in a European patent application corresponding to the instant patent application. This office action translation is submitted now in order to supplement the understanding of patent document EP0881541A1 and JPA2005-055585 which are the office action and are being disclosed in the instant Information Disclosure Statement.
Corresponding Japanese Office Action issued on May 28, 2013 with the Partial English Translation.
Japanese Office Action dated Sep. 4, 2012, issued in the corresponding Japanese Patent Application.
Partial English language translation of the following: Office action dated Dec. 16, 2013 from the Taiwanese Patent Office in a Taiwanese patent application corresponding to the instant patent application. This office action translation is submitted now in order to supplement the understanding of patent documents TW200732837 and TW200639582 which are the office action and are being disclosed in the instant Information Disclosure Statement.

* cited by examiner

*Primary Examiner* — John A. McPherson
(74) *Attorney, Agent, or Firm* — SOLARIS Intellectual Property Group, PLLC

(57) ABSTRACT

The invention provides a green curable composition including a colorant in an amount of 47.5% by mass or more with respect to the total solid content of the green curable composition, the colorant containing a halogenated copper phthalocyanine pigment and a barbituric acid derivative yellow pigment at a ratio of from 6/4 to 3/7 (halogenated copper phthalocyanine pigment/barbituric acid derivative yellow pigment); a colored pattern formed from the green curable composition; a color filter including the colored pattern; a solid-state image sensor including the color filter; and a method of producing the color filter.

18 Claims, No Drawings

GREEN CURABLE COMPOSITION, COLOR FILTER AND METHOD OF PRODUCING SAME

CROSS-REFERENCE TO RELATED APPLICATION

This application claims priority under 35 USC 119 from Japanese Patent Application No. 2008-087557, the disclosure of which is incorporated by reference herein.

BACKGROUND OF THE INVENTION

1. Field of the Invention

The present invention relates to a green curable composition, a color filter and a method of producing the same. In particular, the present invention relates to a green curable composition and a color filter for use in a solid-state image sensor and a method of producing the same.

2. Description of the Related Art

Color filters are an essential component for a solid-state image sensor or a liquid display device (LCD). As a composition for forming a color filter, Japanese Patent Application Laid-Open (JP-A) No. 2-199403 describes a negative-type curable composition including a pigment dispersion, an alkali-soluble resin, a photopolymerizable monomer and a photopolymerization initiator. In recent years, there has been demand for color filters used in a solid-state image sensor to enable even higher image quality, and formation of a fine pattern from a composition containing a colorant at high concentration has been required (see, for example, JP-A No. 2006-317893).

Although a dye is employed as a colorant in JP-A No. 2006-317893, pigments are more widely used in view of fastness. In this regard, JP-A No. 2004-46047 describes a color filter containing a pigment as a colorant at high concentration, rather than a dye.

However, the color filter described in JP-A No. 2004-46047 is for use in LCDs, and the pattern size or pattern shape of a colored pattern used in such a color filter is significantly different from that of a color filter for use in a solid-state image sensor. Specifically, color filter used in solid-state image sensors recently have a pattern size of 2.5 μm or less, which is much smaller than that of a color filter used in LCDs.

As the pattern size becomes smaller, the area of a non-exposed portion of the colored pattern that contacts an alkali developer becomes small, which tends to generate development residue due to poor dissolution.

In addition, as the pattern size becomes smaller, the thickness of the coloring pattern is reduced. In a colored pattern having reduced thickness, the content of a colorant needs to be increased in order to maintain spectroscopic characteristics to a level equal to that of a colored pattern having a thickness that is not reduced. However, if the content of the colorant is increased, generation of development residue may be more pronounced.

In particular, in the case of a green pattern that is often formed in a checkered pattern (hereinafter, referred to as a Bayer pattern), it is difficult to conduct development of a non-exposed part portion of the green pattern as compared with an island pattern of red or blue, thereby increasing the generation of development residue.

In view of the aforementioned circumstances, an object of the invention is to provide a green curable composition for a solid-state image sensor, which can be used to form a green fine pattern having excellent spectroscopic characteristics with a reduced amount of development residue generated at the formation of the fine pattern.

Another object of the invention is to provide a color filter for a solid-state image sensor having excellent spectroscopic characteristics and fineness, and a method of producing the color filter for a solid-state image sensor at high productivity.

SUMMARY OF THE INVENTION

An aspect of the invention provides a green curable composition comprising a colorant in an amount of 47.5 by mass or more with respect to the total solid content of the green curable composition, the colorant containing a halogenated copper phthalocyanine pigment and a barbituric acid derivative yellow pigment at a ratio of from 6/4 to 3/7 (halogenated copper phthalocyanine pigment/barbituric acid derivative yellow pigment).

DETAILED DESCRIPTION OF THE INVENTION

Green Curable Composition for Solid-State Image Sensor

The green curable composition for a solid-state image sensor of the invention (hereinafter, simply referred to as "green curable composition" sometimes) contains at least a colorant containing a halogenated copper phthalocyanine pigment and a barbituric acid derivative yellow pigment at a ratio of 6/4 to 3/7 (halogenated copper phthalocyanine pigment/barbituric acid derivative yellow pigment), the amount of the colorant being 47.5% by mass or more with respect to the total solid content.

By using a green curable composition of the invention having the above composition, it is possible to form a green fine pattern having excellent spectroscopic characteristics and reduce the amount of development residue upon formation of the fine pattern.

Herein, the "excellent spectroscopic characteristics" indicates "excellent spectroscopic characteristics as a green color", and specifically indicates a state in which both of the transmittance in a wavelength region of 400 to 450 nm and the transmittance in a wavelength region of 630 to 650 nm are lowered.

For example, in a green pattern having a film thickness of 1.0 μm, the transmittance in a wavelength region of 400 to 450 nm is preferably 7.5% or less, and more preferably 5.0% or less; and the transmittance in a wavelength region of 630 to 650 nm is preferably 20.0% or less, and more preferably 15.0% or less.

Furthermore, by having the aforementioned composition, rectangularity of the cross-section of the pattern may be improved.

In addition, by having the aforementioned composition, the transmittance at a wavelength of 480 to 500 nm, which is required for a green color filter for a solid-state image sensor, may be improved.

In the following, the pigments, which are essential components of the green curable composition of the invention, will be explained.

<Halogenated Copper Phthalocyanine Pigment>

The colorant according to the invention contains at least one kind of a halogenated copper phthalocyanine pigment.

The halogenated copper phthalocyanine pigment is not particularly limited, but examples thereof include copper phthalocyanines substituted by a fluorine atom, a chlorine atom, a bromine atom, or an iodine atom. Such pigments include, for example, C. I. Pigment Green 7, C. I. Pigment Green 36 and C. I. Pigment Green 37.

The halogen atom as a substituent of the copper phthalocyanine is preferably a chlorine atom or a bromine atom. Among them, a copper phthalocyanine containing both a chlorine atom and a bromine atom as a substituent is most preferable. Accordingly, most preferable examples of the halogenated copper phthalocyanine pigment include C. I. Pigment Green 36.

<Barbituric Acid Derivative Yellow Pigment>

The colorant according to the invention contains at least one kind of a barbituric acid derivative yellow pigment.

The barbituric acid derivative yellow pigment is not particularly limited, but examples thereof include barbituric acid derivatives having a maximum absorption at a wavelength of 400 to 500 nm.

Examples of the barbituric acid derivative yellow pigment include C. I. Pigment Yellow 139, C. I. Pigment Yellow 150, C. I. Pigment Yellow 185, and the like. By using a yellow pigment as mentioned above, generation of residue in a non-exposed portion may be effectively suppressed. Among them, C. I. Pigment Yellow 150, which is a nickel complex, is most preferred from the viewpoint of rectangularity of the cross-section of the pattern.

The colorant in the invention may further contain other colorants in addition to the above-described halogenated copper phthalocyanine pigment and the barbituric acid derivative yellow pigment.

Examples of the colorants that may be included include disazo-based yellow pigments, quinophthalone-based yellow pigments, azomethine-based yellow pigments, isoindoline-based yellow pigments and the like, which are pigments useful in adjusting the green spectroscopic characteristics. Specific examples thereof include C. I. Pigment Yellow 83, C. I. Pigment Yellow 138, C. I. Pigment Yellow 180, and the like.

The total content of the above-mentioned halogenated copper phthalocyanine pigment and the barbituric acid derivative yellow pigment according to the invention is preferably 80 to 100 % by mass, and more preferably 90 to 100 % by mass, with respect to the total content of the colorant from the viewpoint of spectroscopic characteristics.

Moreover, the transmittance at around 530 to 550 nm of the green curable composition according to the invention is preferably as high as possible. In this regard, the particle diameter of the pigment is preferably as small as possible. In view of handling properties, the average particle size (50% accumulation) of the pigment is preferably 10 to 100 nm, more preferably 10 to 70 nm, further preferably 10 to 50 nm, and particularly preferably 10 to 40 nm.

The mass ratio of the halogenated copper phthalocyanine pigment and the barbituric acid derivative yellow pigment (halogenated copper phthalocyanine pigment/barbituric acid derivative yellow pigment) is 6/4 to 3/7. In the invention, it is important that a relatively large amount of the barbituric acid derivative yellow pigment is contained in the colorant.

If the amount of the barbituric acid derivative yellow pigment is less than the above ratio, a residue may remain in a non-exposed portion upon formation of a fine pattern (for example, having a pattern size of 2.5 µm or less). Further, the transmittance at a wavelength of 480 to 500 nm, which may be requisite for a green pattern for a solid-state image sensor, may be lowered.

On the other hand, if the amount of the barbituric acid derivative yellow pigment is more than the above ratio, rectangularity of the cross-section of the pattern may deteriorate.

From the viewpoint of reducing the amount of development residue and improving the rectangularity of the pattern cross-section, the mass ratio of the halogenated copper phthalocyanine pigment and the barbituric acid derivative yellow pigment is more preferably 5.8/4.2 to 4/6, and particularly preferably 5.5/4.5 to 5/5.

The content of the colorant in the green curable composition of the invention is 47.5% by mass or more with respect to the total solid content of the green curable composition.

If the content of the colorant is less than 47.5% by mass, spectroscopic properties that are requisite for a green color filter tends to deteriorate. Specifically, when the thickness of the color filter is small (for example, when the thickness is 1.0 µm or less), it may not be possible to regulate the transmittance at a wavelength region of 400 to 450 nm to 7.5% or less, and to regulate the transmittance at a wavelength region of 630 to 650 nm to, for example, 20.0% or less.

The content of the colorants is preferably 48.0% by mass or more, and more preferably 50.0% by mass or more, from the viewpoint of improving the spectroscopic characteristics.

On the other hand, the upper limit of the content of the colorant is not particularly limited. However, it is preferably 80% by mass, more preferably 75% by mass, and particularly preferably 70% by mass, from the viewpoint of more effectively suppressing a phenomenon in which curing at an exposed portion is insufficient.

<Dispersing Agent>

In the invention, a dispersing agent may be preferably added to the green curable composition from the viewpoint of improving dispersion properties of the pigment.

Examples of the dispersing agent (pigment-dispersing agent) that may be used in the invention include polymeric dispersing agents (such as polyamide amines and salts thereof, polycarboxylic acids and salts thereof, polymeric unsaturated acid esters, modified polyurethanes, modified polyesters, modified poly(meth)acrylates, (meth)acryl-based copolymers, and naphthalene sulfonic acid formalin condensates), polyoxyethylene alkyl phosphoric acid esters, polyoxyethylene alkyl amines, alkanol amines, pigment derivatives, and the like.

The polymeric dispersing agents may be further classified into a linear polymer, a terminal-modified polymer, a graft polymer and a block polymer, in view of the structure thereof.

The polymeric dispersing agent adsorbs to the surface of a pigment, and serves to prevent the re-aggregation of the pigment. Therefore, a terminal-modified polymer, a graft polymer or a block polymer, having an anchoring site to the surface of the pigment, can be mentioned as a preferable structure. On the other hand, the pigment derivative has an effect of modifying the surface of the pigment to promote the adsorption of the polymeric dispersing agent to the surface of the pigment.

Specific examples of the pigment dispersing agent that may be used in the invention include DISPERBYK-101 (polyamideamine phosphate), 107 (carboxylic acid ester), 110 (acidic group-containing copolymer), 130 (polyamide), 161, 162, 163, 164, 165, 166 and 170 (polymeric copolymer) and BYK-P 104 and P 105 (polymeric unsaturated polycarboxylic acids) manufactured by BYK Chemie; EFKA 4047, 4050, 4010 and 4165 (polyurethane-based), EFKA 4330 and 4340 (block copolymer), 4400 and 4402 (modified polyacrylates), 5010 (polyester amide), 5765 (polymeric polycarboxylic acid salt), 6220 (fatty acid polyester), 6745 (phthalocyanine derivative) and 6750 (azo pigment derivative)" manufactured by EFKA CHEMICALS; AJISPER PB 821 and PB 822 manufactured by Ajinomoto Fine-Techno Co., Inc.; FLOWLEN TG-710 (urethane oligomer) and POLY-FLOW No. 50E and No. 300 (acryl-based copolymers) "manufactured by KYOEISHA CHEMICAL Co.,LTD; DISPARLON KS-860, 873SN, 874, #2150 (aliphatic polycarboxylic acids), #7004 (poly ether ester), DA-703-50, DA-705 and DA-725 manufactured by Kusumoto Chemicals Ltd.; DEMOR RN, N (naphthalene sulfonic acid formalin polycondensate), MS, C and SN-B (aromatic sulfonic acid formalin polycondensate), HOMOGENOL L-18 (polymeric polycarboxylic acid), EMULGEN 920, 930, 935 and 985 (polyoxyethylene nonylphenyl ethers) and ACETAMINE 86 (stearyl amine acetate) manufactured by Kao Corporation; SOLSPERSE 5000 (phthalocyanine derivative), 22000 (azo pigment derivative), 13240 (polyester amine), 3000, 17000, 27000 (high molecules having a functional moiety in the end part), 24000, 28000, 32000 and 38500 (graft-type high molecules) manufactured by Lubrizol Japan Ltd.; NIKKOL T106 (polyoxyethylene sorbitan monooleate) and MYS-IEX (polyoxyethylene monostearate) manufactured by Nikko Chemicals Co., Ltd.; and the like.

These dispersing agents may be used alone, or may be used in combination of two or more kinds. In the invention, it is particularly preferable to use a pigment derivative and a polymeric dispersing agent in combination.

The content of the dispersing agent in the invention is preferably 1 to 100% by mass, more preferably 3 to 100% by mass, and further preferably 5 to 80% by mass with respect to the amount of the pigment.

Specifically, when a polymeric dispersing agent is used, the amount thereof is preferably in the range of 5 to 100% by mass, more preferably in the range of 10 to 80% by mass with respect to the amount of the pigment. When a pigment derivative is used, the amount thereof is preferably in the range of 1 to 30% by mass, more preferably in the range of 3 to 20% by mass, and particularly preferably in the range of 5 to 15% by mass with respect to the amount of the pigment.

In the invention, when a pigment as a colorant and a dispersing agent are used in combination, the total content thereof is preferably 30% by mass or more and 90% by mass or less, more preferably 40% by mass or more and 85% by mass or less, and further preferably 50% by mass or more and 80% by mass or less with respect to the total solid content of the green curable composition, from the viewpoint of curing sensitivity and color density.

<Pigment-Dispersing Resin>

In the green curable composition of the invention, the pigment may be further dispersed using a pigment-dispersing resin, in addition to the aforementioned dispersing agent, from the viewpoint of improving temporal stability by suppressing aggregation of the pigment.

As the pigment-dispersing resin, generally known linear organic polymers may be used without being particularly limited. Preferably, a linear organic polymer that is soluble or swellable in water or weak alkaline water is used in order to enable water development or weak alkaline water development. The linear organic polymer may be used depending on usage not only as a film forming agent, but also as a developer with water, weak alkali water or organic solvent. For example, water development may be carried out by using a water-soluble linear organic polymer. Specific examples of the linear organic polymer include radical polymers having a carboxylic acid group in a side chain, such as those described in JP-A No. 59-44615, Japanese Patent Publication (JP-B) No. 54-34327, JP-B No. 58-12577, JP-B No. 54-25957, JP-A No. 54-92723, JP-A No. 59-53836, and JP-A No. 59-71048, i.e., resins obtained by homopolymerization or copolymerization of a monomer having a carboxyl group; resins obtained by hydrolysis or half-esterification or half-amidation of acid anhydride unit, which is obtained by homopolymerization or copolymerization of a monomer having an acid anhydride; epoxy acrylates obtained by modifying an epoxy resin with an unsaturated monocarboxylic acid and an acid anhydride; and the like. Monomers having a carboxyl group include acrylic acid, methacrylic acid, itaconic acid, crotonic acid, maleic acid, fumaric acid, 4-carboxyl styrene, and the like. Monomers having an acid anhydride include maleic acid anhydride and the like.

Other examples include acidic cellulose derivatives having a carboxylic acid group in a side chain. In addition, those obtained by adding a cyclic acid anhydride to a polymer having a hydroxy group and the like are also useful.

When a copolymer is used as the alkali-soluble resin, other monomers than the aforementioned may also be used as a copolymerization component. Examples of the other monomers include compounds described in (1) to (13) below.

(1) Acrylates and methacrylates having an aliphatic hydroxy group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-aryloxyethyl acrylate and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-aryloxyethyl methacrylate and propargyl methacrylate.

(4) Acrylic amides or methacrylic amides such as acrylic amide, methacrylic amide, N-methylol acrylic amide, N-ethyl acrylic amide, N-hexyl methacrylic amide, N-cyclohexyl acrylic amide, N-hydroxyethyl acrylic amide, N-phenyl acrylic amide, N-nitrophenyl acrylic amide, N-ethyl-N-phenyl acrylic amide, vinyl acrylic amide, vinyl methacrylic amide, N,N-diallyl acrylic amide, N,N-diallyl methacrylic amide, allyl acrylic amide and allyl methacrylic amide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloro acetate, vinyl butyrate and vinyl benzoate.

(7) Styrenes such as styrene, α-methyl styrene, methyl styrene, chloromethyl styrene and p-acetoxy styrene.

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene.

(10) N-vinyl pyrrolidone, acrylonitrile, methacrylonitrile and the like.

(11) Unsaturated imides such as maleimide, N-acryloyl acrylic amide, N-acetyl methacrylic amide, N-propionyl methacrylic amide and N-(p-chlorobenzoyl)methacrylic amide.

(12) Methacrylic acid-based monomers including a heteroatom bonded at an α-position, such as the compounds described in JP-A Nos. 2002-309057 and 2002-311569, or the like.

Among them, (meth)acrylic resins having an allyl group or a vinyl ester group and a carboxyl group in a side chain, and alkali-soluble resins having a double bond in a side chain described in JP-A Nos. 2000-187322 and 2002-62698, and alkali-soluble resins having an amide group in a side chain described in JP-A No. 2001-242612 exhibit an excellent balance of sensitivity and development properties.

In addition, urethane-based binder polymers containing an acidic group described in JP-B No. 7-12004, 7-120041, JP-B No. 7-120042 and 8-12424, JP-A No. 63-287944, 63-287947, 1-271741 and 11-352691 or the like, and urethane-based polymers having an acidic group and a double bond in a side chain described in JP-A No. 2002-107918 exhibit particularly excellent strength, and thus advantageous in terms of compatibility with low-level exposure.

In addition, acetal-modified polyvinyl alcohol polymers having an acidic group as described in European Patent Nos. 993966 and 1204000, JP-A No. 2001-318463 or the like exhibit excellent development properties and are favorable.

Other usable water-soluble linear polymers include polyvinylpyrrolidone, polyethylene oxide, and the like. In addition, alcohol-soluble nylon, polyether of 2,2-bis-(4-hydroxyphenyl)-propane and epichlorohydrin and the like are also useful for enhancing the strength of a cured film.

Among the pigment-dispersing resins explained above, a pigment-dispersing resin having an unsaturated double bond is preferable from the viewpoint of curing properties at an exposed portion.

The weight-average molecular weight of the pigment-dispersing resin that may be used in the invention is preferably 5,000 or more, further preferably in the range of 10,000 to 300,000. The number-average molecular weight of the same is preferably 1,000 or more, further preferably in the range of 2,000 to 250,000. The polydispersity index (weight-average molecular weight/number-average molecular weight) is preferably 1 or more, further preferably in the range of 1.1 to 10.

Such pigment-dispersing resins may be any of a random polymer, a block polymer, a graft polymer and the like.

The pigment-dispersing resin that can be used in the invention can be synthesized by a known method. Examples of the solvent that may be used in the synthesis include tetrahydrofuran, ethylene dichloride, cyclohexanone, methylethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, water, and the like. These solvents may be used alone or in combination of two or more kinds.

Examples of a radical polymerization initiator that may be used in the synthesis of the pigment-dispersing resin include known compounds such as an azo-based initiator, a peroxide initiator, or the like.

In the invention, it is important that the pigment-dispersing resin does not damage the curing properties at an exposed portion. Examples of the most suitable pigment-dispersing resin include those having the structure of (1) to (3) below.

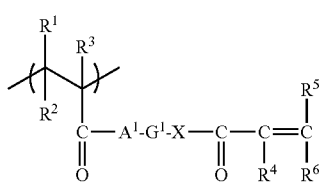

Formula (1)

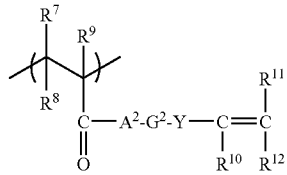

Formula (2)

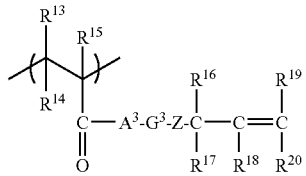

Formula (3)

In Formulae (1) to (3), $A^1$, $A^2$ and $A^3$ each independently represent an oxygen atom, a sulfur atom or $-N(R^{21})-$, where $R^{21}$ represents an alkyl group that may have a substituent. $G^1$, $G^2$ and $G^3$ each independently represent a bivalent organic group. X and Z each independently represent an oxygen atom, a sulfur atom or $-N(R^{22})-$, where $R^{22}$ represents an alkyl group that may have a substituent. Y represents an oxygen atom, a sulfur atom, a phenylene group that may have a substituent, or $-N(R^{23})-$, where $R^{23}$ represents an alkyl group that may have a substituent. $R^1$ to $R^{20}$ each independently represent a hydrogen atom or a monovalent substituent.

In Formula (1), $R^1$ to $R^3$ each independently represent a hydrogen atom or a monovalent substituent, including a hydrogen atom or an alkyl group that may have a substituent, or the like. Among them, $R^1$ and $R^2$ are preferably a hydrogen atom, and $R^3$ is preferably a hydrogen atom or a methyl group.

$R^4$ to $R^6$ each independently represent a hydrogen atom or a monovalent substituent, and examples of $R^4$ include a hydrogen atom or an alkyl group that may have a substituent, or the like, preferably a hydrogen atom, a methyl group or an ethyl group. In addition, $R^5$ and $R^6$ each independently represent a hydrogen atom or a monovalent substituent. Example of $R^5$ and $R^6$ include a hydrogen atom, a halogen atom, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylsulfonyl group that may have a substituent, an arylsulfonyl group that may have a substituent, or the like, preferably a hydrogen atom, an alkoxycarbonyl group, an alkyl group that may have a substituent, or an aryl group that may have a substituent.

Herein, examples of the substituent include a methoxycarbonyl group, an ethoxycarbonyl group, an isopropyloxycarbonyl group, a methyl group, an ethyl group, a phenyl group, or the like.

$A^1$ represents an oxygen atom, a sulfur atom or $-N(R^{21})-$, and X represents an oxygen atom, a sulfur atom or $-N(R^{22})-$. Examples of $R^{21}$ and $R^{22}$ include an alkyl group that may have a substituent.

$G^1$ represents a bivalent organic group, preferably an alkylene group that may have a substituent, more preferably an alkylene group having 1 to 20 carbon atoms that may have a substituent, a cycloalkylene group having 3 to 20 carbon atoms that may have a substituent, an aromatic group having 6 to 20 carbon atoms that may have a substituent, and the like. Among them, $G^1$ is preferably a linear or branched alkylene group having 1 to 10 carbon atoms that may have a substituent, a cycloalkylene group having 3 to 10 carbon atoms that may have a substituent, or an aromatic group having 6 to 12 carbon atoms that may have a substituent, in terms of such performances as strength and developability.

Examples of the substituent that may be included in $G^1$ preferably include a hydroxyl group, and substituents other than a substituent having a heteroatom to which a hydrogen atom is bonded excluding a hydroxyl group (for example, an amino group, a thiol group, a carboxyl group or the like).

The structural unit represented by Formula (1) preferably has a structure in which $A^1$ is an oxygen atom, a sulfur atom or —N($R^{21}$)—, X is an oxygen atom, a sulfur atom or —N($R^{22}$)—, $G^1$ is an alkylene group that may have a substituent, $R^1$ and $R^2$ are a hydrogen atom, $R^3$ is a hydrogen atom or a methyl group, $R^4$ is a hydrogen atom or an alkyl group, $R^5$ and $R^6$ each independently are a hydrogen atom, an alkoxycarbonyl group, an alkyl group or an aryl group, and $R^{21}$ and $R^{22}$ are an alkyl group.

$R^7$ to $R^9$ in Formula (2) each independently represent a hydrogen atom or a monovalent substituent, such as a hydrogen atom, an alkyl group that may have a substituent, or the like. Among them, $R^7$ and $R^8$ are preferably a hydrogen atom, and $R^9$ is preferably a hydrogen atom or a methyl group.

$R^{10}$ to $R^{12}$ each independently represent a hydrogen atom or a monovalent substituent, and specific examples thereof include a hydrogen atom, a halogen atom, a dialkyl amino group, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylsulfonyl group that may have a substituent, an arylsulfonyl group that may have a substituent, and the like. Among them, $R^{10}$ to $R^{12}$ are preferably a hydrogen atom, an alkoxycarbonyl group, an alkyl group that may have a substituent, or an aryl group that may have a substituent.

Examples of the substituent include those mentioned in Formula (1).

$A^2$ represents an oxygen atom, a sulfur atom or —N($R^{21}$)—. Examples of $R^{21}$ include a hydrogen atom, an alkyl group that may have a substituent, or the like.

$G^2$ represents a bivalent organic group, preferably an alkylene group that may have a substituent. Preferably, $G^2$ is an alkylene group having 1 to 20 carbon atoms that may have a substituent, a cycloalkylene group having 3 to 20 carbon atoms that may have a substituent, an aromatic group having 6 to 20 carbon atoms that may have a substituent, or the like. Among them, $G^2$ is preferably a linear or branched alkylene group having 1 to 10 carbon atoms that may have a substituent, a cycloalkylene group having 3 to 10 carbon atoms that may have a substituent, or an aromatic group having 6 to 12 carbon atoms that may have a substituent, in terms of such performances as strength and developability.

Herein, the substituent that may included in $G^2$ is preferably a hydroxyl group, and substituents other than a substituent having a heteroatom to which a hydrogen atom is bonded excluding a hydroxyl group (for example, an amino group, a thiol group, a carboxyl group or the like).

When $G^2$ has a substituent including a heteroatom to which a hydrogen atom is bonded, excluding a hydroxyl group, preservation stability may deteriorate by using an onium salt compound in combination as an initiator described later.

Y represents an oxygen atom, a sulfur atom, —N($R^{23}$)— or a phenylene group that may have a substituent. Examples of $R^{23}$ include a hydrogen atom, an alkyl group that may have a substituent, and the like.

The structural unit represented by Formula (2) preferably has a structure in which $R^{10}$ is a hydrogen atom or an alkyl group, $R^{11}$ and $R^{12}$ each independently are a hydrogen atom, an alkoxycarbonyl group, an alkyl group or an aryl group, $R^7$ and $R^8$ are a hydrogen atom, $R^9$ is a hydrogen atom or a methyl group, $A^2$ is an oxygen atom, a sulfur atom or —N($R^{21}$)—, $G^2$ is a linear or branched alkylene group having 1 to 10 carbon atoms that may have a substituent, a cycloalkylene group having 3 to 10 carbon atoms that may have a substituent, an aromatic group having 6 to 12 carbon atoms that may have a substituent, Y is an oxygen atom, a sulfur atom, —N($R^{23}$)— or a phenylene group that may have a substituent, and $R^{21}$ and $R^{23}$ are a hydrogen atom or an alkyl group that may have a substituent.

$R^{13}$ to $R^{15}$ in Formula (3) each independently represent a hydrogen atom or a monovalent substituent, such as a hydrogen atom, an alkyl group that may have a substituent, or the like. Among them, $R^{13}$ and $R^{14}$ are preferably a hydrogen atom, and $R^{15}$ is preferably a hydrogen atom or a methyl group.

$R^{16}$ to $R^{20}$ each independently represent a hydrogen atom or a monovalent substituent. Examples of $R^{16}$ to $R^{20}$ include a hydrogen atom, a halogen atom, a dialkylamino group, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylsulfonyl group that may have a substituent, an arylsulfonyl group that may have a substituent, and the like. Among them, $R^{16}$ to $R^{20}$ are preferably a hydrogen atom, an alkoxycarbonyl group, an alkyl group that may have a substituent or an aryl group that may have a substituent. Examples of the substituent that may be introduced include those mentioned in Formula (1).

$A^3$ represents an oxygen atom, a sulfur atom or —N($R^{21}$)—, and Z represents an oxygen atom, a sulfur atom or —N($R^{22}$)—. Examples of $R^{21}$ or $R^{22}$ include those mentioned in Formula (1).

$G^3$ represents a bivalent organic group, and is preferably an alkylene group that may have a substituent. Preferably, $G^3$ is an alkylene group having 1 to 20 carbon atoms that may have a substituent, a cycloalkylene group having 3 to 20 carbon atoms that may have a substituent, an aromatic group having 6 to 20 carbon atoms that may have a substituent, or the like. Among them, $G^3$ is preferably a linear or branched alkylene group having 1 to 10 carbon atoms that may have a substituent, a cycloalkylene group having 3 to 10 carbon atoms that may have a substituent, or an aromatic group having 6 to 12 carbon atoms that may have a substituent, in terms of such performances as strength or developability.

Examples of the substituent that may included in $G^3$ preferably include a hydroxyl group, and substituents other than a substituent having a heteroatom to which a hydrogen atom is bonded excluding a hydroxyl group (for example, an amino group, a thiol group, a carboxyl group or the like).

The structural unit represented by Formula (3) preferably has a structure in which $R^{13}$ and $R^{14}$ are a hydrogen atom, $R^{15}$ is a hydrogen atom or a methyl group, $R^{16}$ to $R^{20}$ are a hydrogen atom, an alkoxycarbonyl group, a alkyl group that may have a substituent or an aryl group that may have a substituent, $A^3$ is an oxygen atom, a sulfur atom or —N($R^{21}$)—, Z is an oxygen atom, a sulfur atom or —N($R^{22}$)—, $R^{21}$ and $R^{22}$ are those mentioned in Formula (1), and $G^3$ is a linear or branched alkylene group having 1 to 10 carbon atoms that may have a substituent, a cycloalkylene group having 3 to 10 carbon atoms that may have a substituent or an aromatic group having 6 to 12 carbon atoms that may have a substituent.

Synthesis of the polymeric compound having a structural unit represented by any of Formulae (1) to (3) mentioned above may be performed, for example, based on the synthesis method described in Paragraph Nos. [0027] to [0057] of JP-A No. 2003-262958. Among them, synthesis of the polymeric compound is preferably performed by the synthesis method No. 1 of the same publication.

The aforementioned resin containing an unsaturated group is preferably a resin obtained by the following synthesis method (1) or (2).

(1) A method of producing a desired polymeric compound having a structure represented by Formula (1), in which a polymer, which has been synthesized using a compound represented by the following Formula (4) as a copolymerization component, is reacted with a base to extract a proton and eliminate a group represented by L.

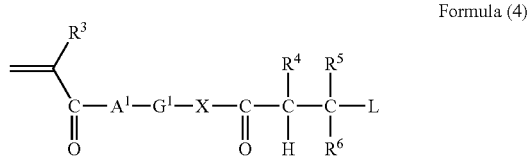

Formula (4)

L in Formula (4) represents an anionic leaving group, preferably a halogen atom, an alkylsulfonyloxy group, an arylsulfonyloxy group, or the like. $R^3$ to $R^6$, $A^1$, $G^1$ and X have the same definitions as mentioned in Formula (1).

The base used for causing the elimination reaction may be either an inorganic compound or an organic compound. Details and preferable exemplary embodiments of this method are described in paragraph Nos. [0028] to [0033] of JP-A No. 2003-262958.

Preferable examples of the inorganic compound base include sodium hydroxide, potassium hydroxide, sodium carbonate, sodium hydrocarbonate, potassium carbonate, potassium hydrocarbonate, and the like. Preferable examples of the organic compound base include metal alkoxides such as sodium methoxide, sodium ethoxide and potassium t-butoxide, organic amine compounds such as triethyl amine, pyridine and diisopropylethyl amine, or the like.

(2) A method of producing a radical reactive group in which a polymer, which has been synthesized using a compound represented by the following Formula (5) as a copolymerization component, is treated with a base to cause elimination reaction of a specific functional group to remove a group represented by $X^1$.

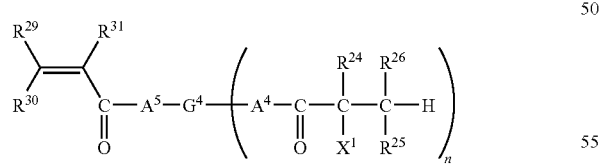

Formula (5)

$A^4$ in Formula (5) represents an oxygen atom, a sulfur atom or —N($R^{27}$)—. $A^5$ represents an oxygen atom, a sulfur atom or —$NR^{28}$—, $R^{24}$, $R^{25}$, $R^{26}$, $R^{27}$, $R^{28}$, $R^{29}$, $R^{30}$ and $R^{31}$ each independently represent a hydrogen atom or a monovalent organic group. $X^1$ represents a group to be removed by the elimination reaction. $G^4$ represents an organic linking group. n represents an integer of 1 to 10.

In the invention, $A^4$ is preferably an oxygen atom. In addition, $R^{24}$ is preferably a methyl group, $R^{25}$, $R^{26}$, $R^{29}$ and $R^{30}$ are preferably a hydrogen atom, and $R^{31}$ is preferably a methyl group or a hydrogen atom. Furthermore, $X^1$ is preferably a bromine atom and $G^4$ is preferably an ethylene group.

Details and preferable exemplary embodiments of the aforementioned methods are described in JP-A No. 2003-335814.

Preferably examples of the resin that may be obtained by the above synthesis method (2) include the polymeric compounds described in JP-A No. 2003-335814, for example, (i) the polyvinyl-based polymeric compounds, (ii) the polyurethane-based polymeric compounds, (iii) the polyurea-based polymeric compounds, (iv) the poly(urethane-urea)-based polymeric compounds, (v) the polyester-based polymeric compounds, (vi) the polyamide-based polymeric compounds, (vii) the acetal-modified polyvinyl alcohol-based polymeric compounds, and specific compounds that may be obtained from the aforementioned compounds.

Specific examples of the compound represented by the above Formula (4) include Compounds (M-1) to (M-12) described below, but the invention is not limited thereto.

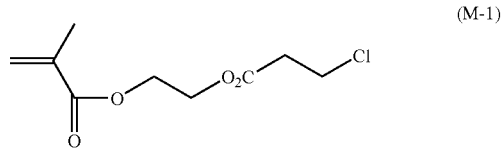

(M-1)

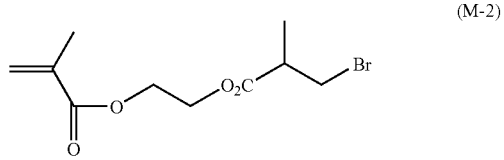

(M-2)

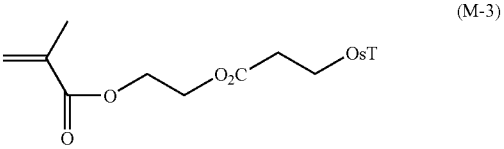

(M-3)

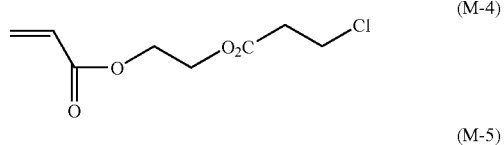

(M-4)

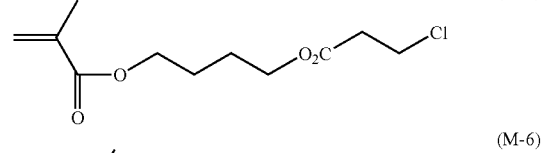

(M-5)

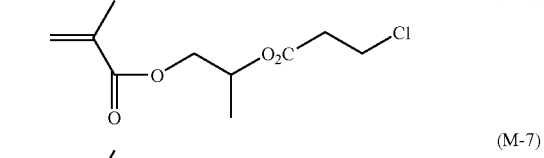

(M-6)

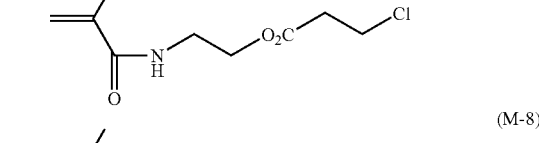

(M-7)

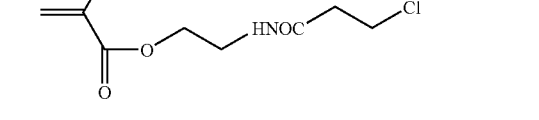

(M-8)

Examples of the compound represented by above Formula (5) include Compounds (i-1) to (i-52) described below, but the invention is not limited thereto.

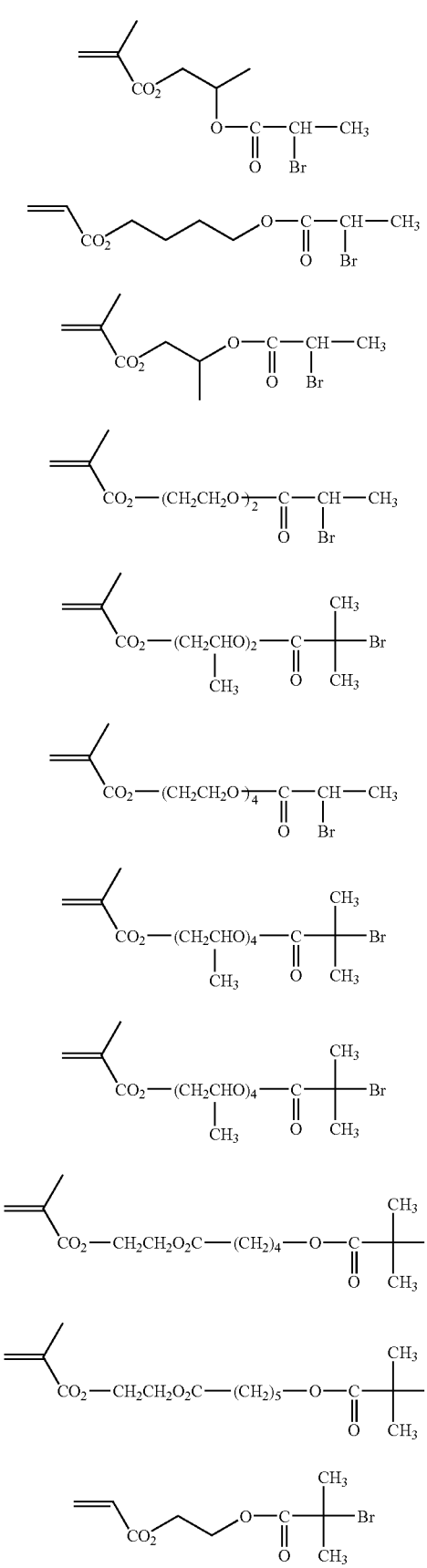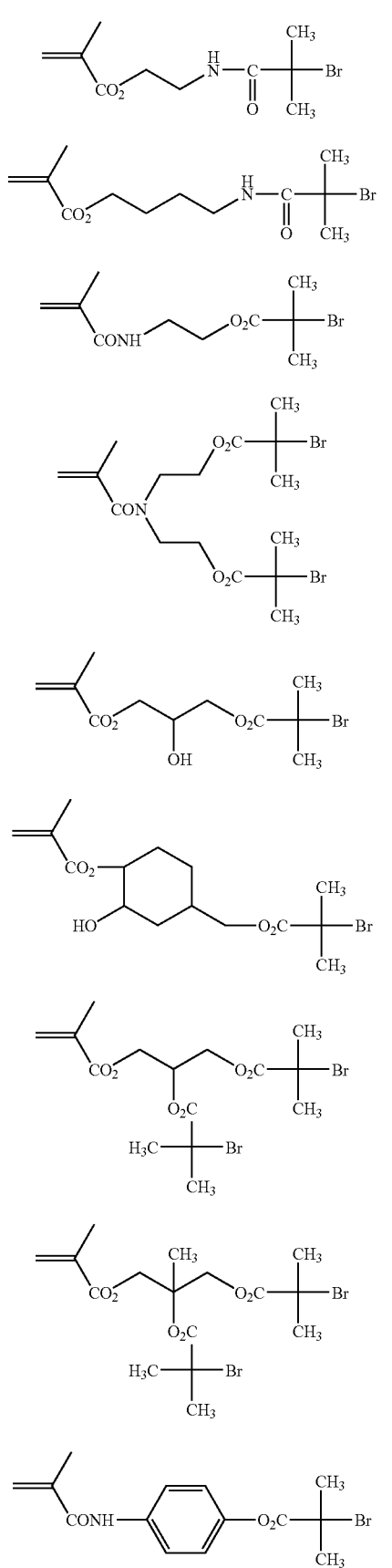

-continued

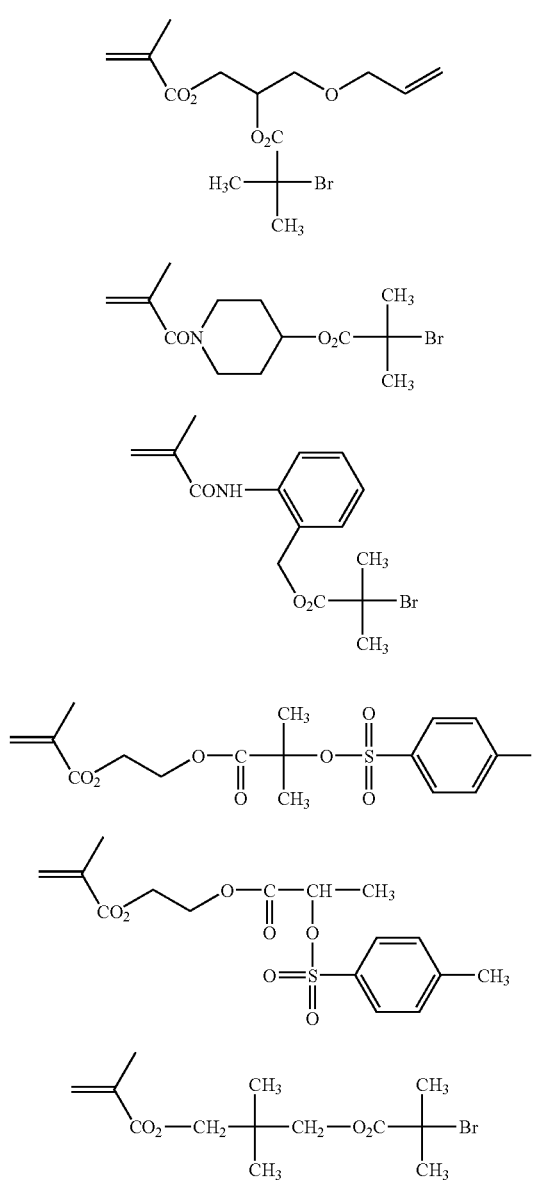

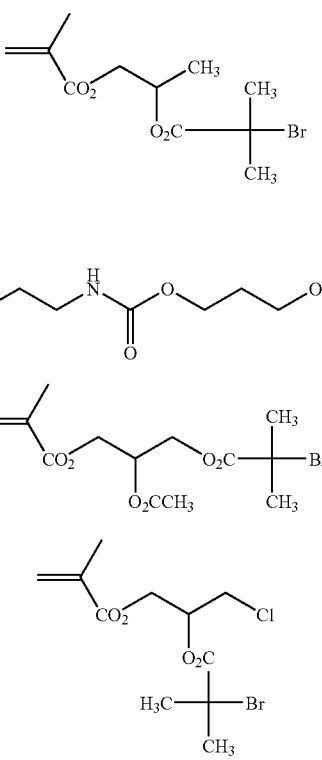

The acid value of the pigment-dispersing resin in the invention is preferably in the range of 5 to 200 mg KOH/g, more preferably in the range of 7 to 150 mg KOH/g, and further preferably in the range of 10 to 100 mg KOH/g. If the acid value is more than 200 mg KOH/g, the pattern peeling tends to occur in development. In addition, if the acid value is less than 5 mg KOH/g, alkali development properties may be remarkably reduced.

The acid value in the invention can be calculated, for example, from the average content of acidic group in a resin molecule. In addition, it is possible to obtain a resin having a desired acid value by changing the content of acidic group-containing monomer unit that constitutes the resin.

Specific examples of the resin compound according to the invention include the following polymeric compounds P-1 to P-5 shown in the table below.

| Polymeric Compound | Acid value (mgKOH/g) | Mw |
|---|---|---|
| P-1 | 54 | 15000 |
| P-2 | 49 | 36000 |

-continued

| Polymeric Compound | Acid value (mgKOH/g) | Mw |
|---|---|---|
| P-3 (structures shown with subscripts 35, 55, 10) | 34 | 24000 |
| P-4 (structures shown with subscripts 30, 55, 15) | 44 | 13000 |
| P-5 (structures shown with subscripts 23, 37, 40) | 100 | 31000 |

Mw: Weight average molecular weight

The weight-average molecular weight of the resin in the invention is preferably 5,000 to 300,000, more preferably 6,000 to 250,000, and further preferably 75,000 to 200,000 from the viewpoint of suppressing the exfoliation of the pattern and achieving favorable development properties.

The weight-average molecular weight of above-mentioned resin may be measured, for example, by GPC.

The content of the resin with respect to the total solid content of the green curable composition of the invention is 0.1% by mass or more and 7.0% by mass or less, but preferably 0.3 to 6.0% by mass and more preferably 1.0 to 5.0% by mass, from the viewpoint of achieving the balance between the suppression of exfoliation of the pattern and the suppression of development residue.

<Polymeric Compound>

The green curable composition of the invention preferably contains at least one kind of a polymeric compound.

The polymeric compound is not particularly limited, but preferably a radical polymerizable monomer.

The radical polymerizable monomer preferably has a boiling point of 100° C. or more at normal pressures, and includes at least one addition-polymerizable ethylenic unsaturated group.

Examples of the radical polymerizable monomer include mono-functional acrylates and methacrylates such as polyethylene glycol mono(meth)acrylate, polypropylene glycol mono(meth)acrylate and phenoxyethyl(meth)acrylate; polyfunctional acrylates and methacrylates such as polyethylene glycol di(meth)acrylate, trimethylol ethane tri(meth)acrylate, neopentyl glycol di(meth)acrylate, pentaerythritol tri(meth) acrylate, pentaerythritol tetra(meth)acrylate, dipentaerythritol penta(meth)acrylate, dipentaerythritol hexa(meth)acrylate, hexanediol(meth)acrylate, trimethylol propane tri(acryloyloxypropyl)ether, tri(acryloyloxyethyl)isocyanurate, those synthesized into a (meth)acrylate after adding ethylene oxide or propylene oxide to a polyfunctional alcohol such as glycerin and trimethylol ethane, urethane acrylates described in JP-B No. 48-41708 and 50-6034 and JP-A No. 51-37193, polyester acrylates described in JP-A No. 48-64183, JP-B No. 49-43191 and JP-B No. 52-30490, and epoxy acrylates that are a reaction product of an epoxy resin and (meth)acrylic acid; and a mixture thereof. Furthermore, those described as photo-curable monomers and oligomers in Journal of the Adhesion Society of Japan, Vol. 20, No. 7, pp. 300-308 may also be used.

The green curable composition of the invention preferably includes at least one kind of acidic group-containing monomer. Further, the content of the acidic group-containing monomer is preferably determined so that the acid value of the total content of the monomer is in a range of 25 mg KOH/g or more. If the amount of the acidic group-containing monomer is such that the acid value of the total monomer content is less than 25 mg KOH/g, a residue may be generated at a non-exposed portion. In other words, there is a fear that a residue may occur at a portion on which a colored pattern is not formed, and a colorant may remain even after the development has been conducted. Further, there is a fear that intermixing of two or more colors may occur upon formation of a multicolored filter by forming a colored pattern of a second color onto a colored pattern of a first color that has been previously formed, because adsorption of the second colorant to the first colored pattern cannot be avoided.

By containing at least one kind of acidic group-containing monomer as a monomer component in the green curable composition of the invention, it is possible to obtain a green curable composition that exhibits high sensitivity and generates less residue, and can form a fine colored pattern having a favorable rectangular pattern profile, even if a colorant is contained at high concentration. In other words, the green curable composition of the invention may be effectively used for the formation of a colored pattern for a solid-state image sensor which requires, for example, a fine pattern of as small as 2 μm or less and a thickness of as small as 1 μm or less.

The acidic group-containing monomer preferably achieves the acid value of 25 mg KOH/g or more, and may be used alone or in combination of two or more. In the invention, other kinds of radical polymeric monomer may be used in combination with the acidic group-containing monomer. When the acidic group-containing monomer and the other radical polymeric monomer are used in combination, the acid value of the total monomer content is calculated as an acid value of the total content of the monomers including the acidic group-containing monomer and the other radical polymeric monomer.

Since the aforementioned acidic group-containing monomer and other radical polymeric monomer are a compound that is polymerized and cured by the action of a photopolymerization initiator, such as an oxime-based photopolymerization initiator described later, it is possible to obtain a negative-type green curable composition of the invention.

The acidic group-containing monomer is not particularly limited as long as it has at least one acidic group and at least one polymerizable group in one molecule, and may be suitably selected from known compounds. Suitable acidic groups include a carboxyl group, a sulfo group, a phosphoric acid group and the like, preferably a carboxyl group or a sulfo group, and particularly preferably a carboxyl group.

In the invention, a polyfunctional acidic group-containing monomer having three or more polymerizable groups is preferable from the viewpoint of maintaining curability, and preventing a residue, or a colorant resulting therefrom, from remaining. Further, the acidic group-containing monomer preferably has four or more functional groups.

Among them, the acidic group-containing monomer is preferably a polyfunctional monomer having three or more (meth)acryloyl groups (hereinafter, referred to as the "polyfunctional acidic group-containing (meth)acrylic compound"), from the viewpoint of maintaining curability, and preventing a residue or colorant from remaining on a portion where no colored pattern is formed, as well as suppressing intermixing of colors that occurs when a colored filter of a second color is formed on a colored filter of a first color due to a residue or a colorant of the second color remaining on the colored pattern of the first color. In this regard, the acidic group-containing monomer is preferably a polyfunctional acidic group-containing (meth)acrylic compound having a boiling point of 100° C. or more at normal pressures, and an acid value of 25 mg KOH/g or more.

The aforementioned "polyfunctional acidic group-containing (meth)acrylic compound having a boiling point of 100° C. or more at normal pressures and an acid value of 25 mg KOH/g or more" is not particularly limited, but is preferably a compound having three or more ethylenic double bonds capable of addition polymerization. Examples of the aforementioned (meth)acrylic compound include a compound obtained by introducing an acidic group as mentioned above (preferably, a carboxyl group or a sulfo group, especially a carboxyl group) by bringing a hydroxyl group of a hydroxyl group-containing pentafunctional acrylic compound into reaction (for example, a compound obtained by substituting an OH site of dipentaerythritol pentacrylate with a carboxyl group-containing substituent, and the like).

The polyfunctional acidic group-containing (meth)acrylic compound preferably has a high degree of viscosity from the viewpoint of adjusting the viscosity of a resist solution upon preparation thereof. More specifically, the viscosity is preferably 11,500 mPa·s or more at 25° C. Among them, the viscosity is preferably in the range of 11,500 to 100,000 mPa·s at 25° C, more preferably in the range of 12,000 to 100,000 mPa·s at 25° C., and further preferably in the range of 20,000 to 100,000 mPa·s at 25° C.

The viscosity is measured by an ordinary method while adjusting the temperature to 25° C. The viscosity is measured, for example, using a rotary viscometer (for example, a rotary viscometer manufactured by TOKI SANGYO CO., LTD.), or an oscillating viscometer (for example, SV-10 (manufactured by AND Corporation)).

The polyfunctional acidic group-containing (meth)acrylic compound includes one or more acidic groups and three or more polymerizable groups (for example, ethylenic double bond) within one molecule, and has a relatively small molecular size. The weight-average molecular weight of the compound in terms of polystyrene is usually less than 3,000.

Specific examples of the polyfunctional acidic group-containing (meth)acrylic compound include compounds represented by the following Formula (III-1) or Formula (III-2). However, in the invention, the polyfunctional acidic group-containing (meth)acrylic compound is not limited thereto.

In the following formulae, if T or G is an oxyalkylene group, the carbon atom-side end thereof is bonded to R, X and W.

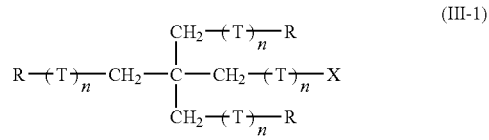

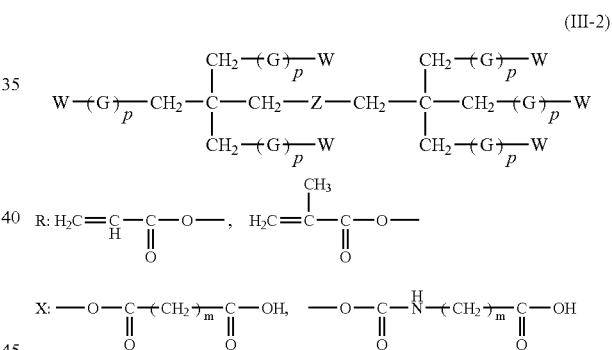

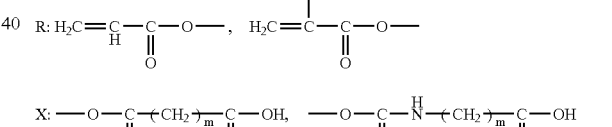

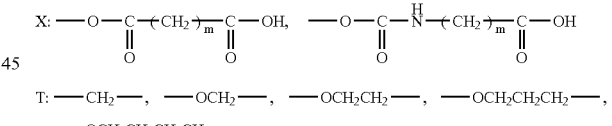

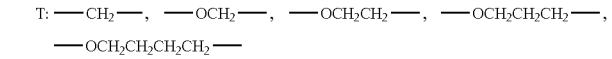

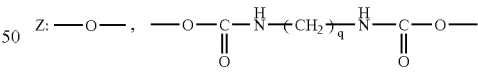

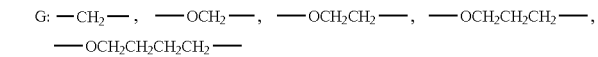

In Formula (III-1), n is 0 to 14, and m is 1 to 8. In Formula (III-2), W has the same definition as R or X in Formula (III-1), and at least three of W are R. p is 0 to 14, and q is 1 to 8. Each of R, X, T and G within one molecule may be the same or different.

Hereinafter, specific examples of the compound represented by Formula (III-1) or Formula (III-2) are shown. However, in the invention, the compound is not limited thereto.

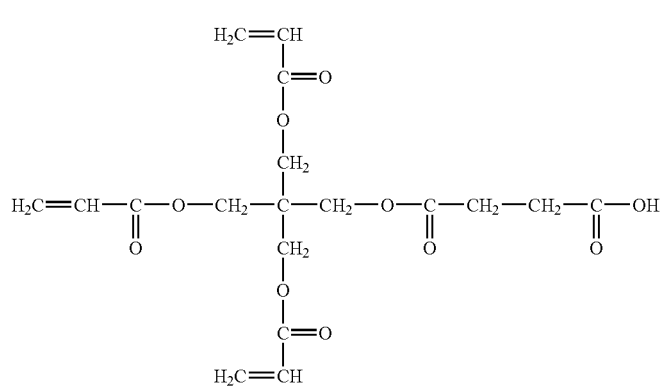
(M-1)
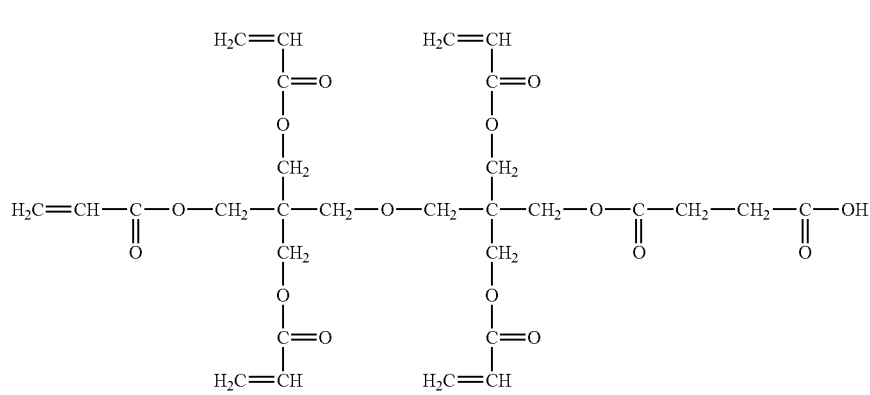
(M-2)
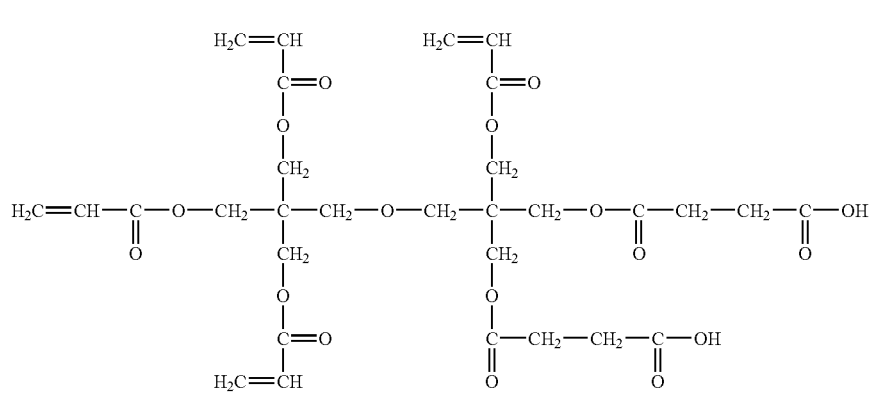
(M-3)
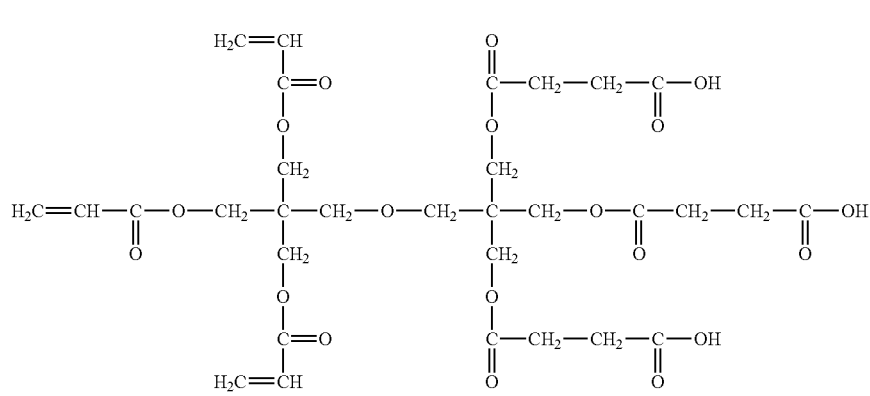
(M-4)

-continued
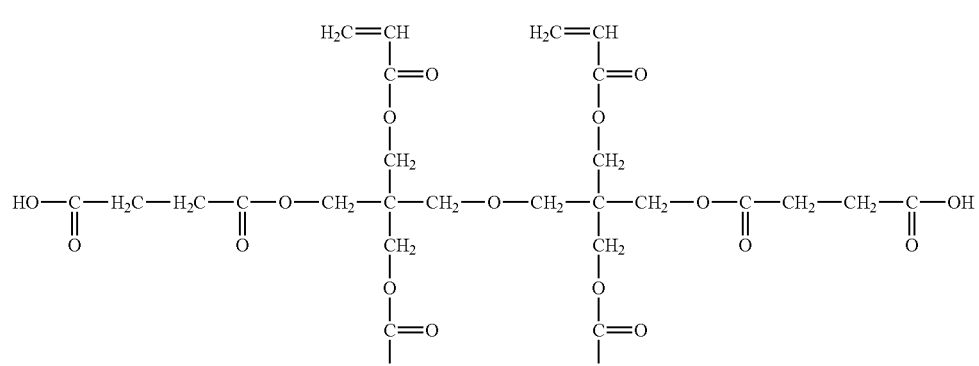
(M-5)
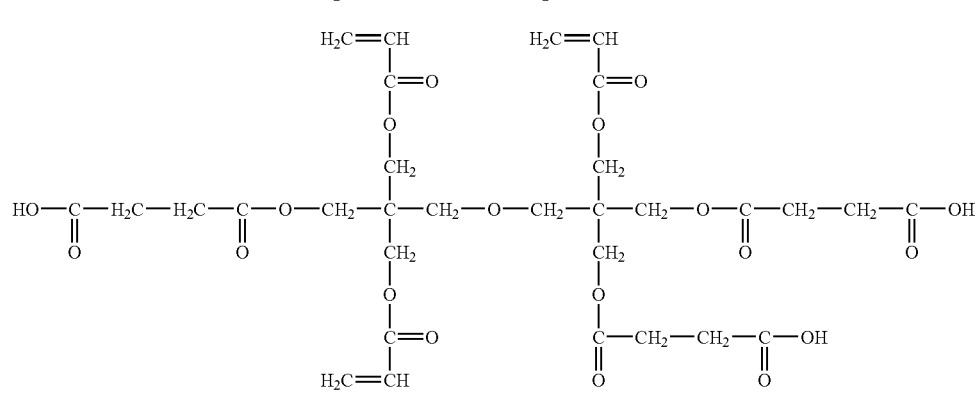
(M-6)
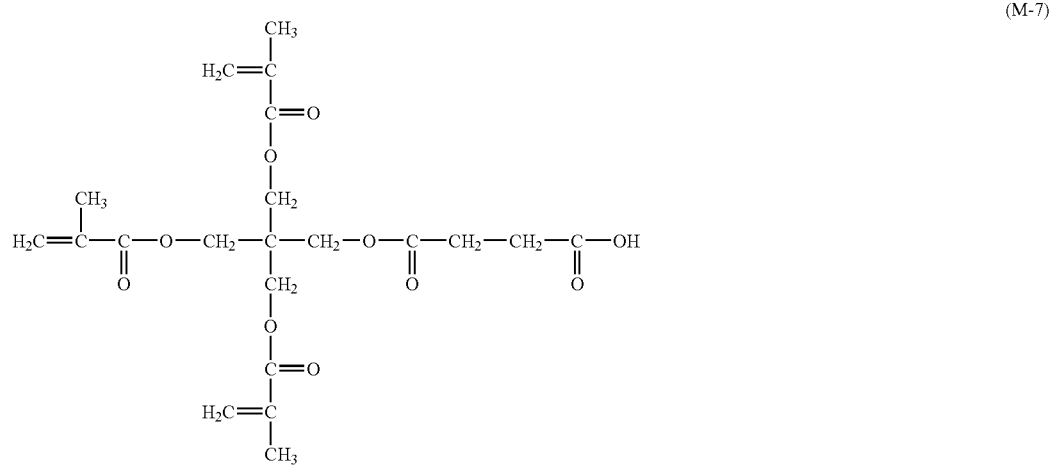
(M-7)
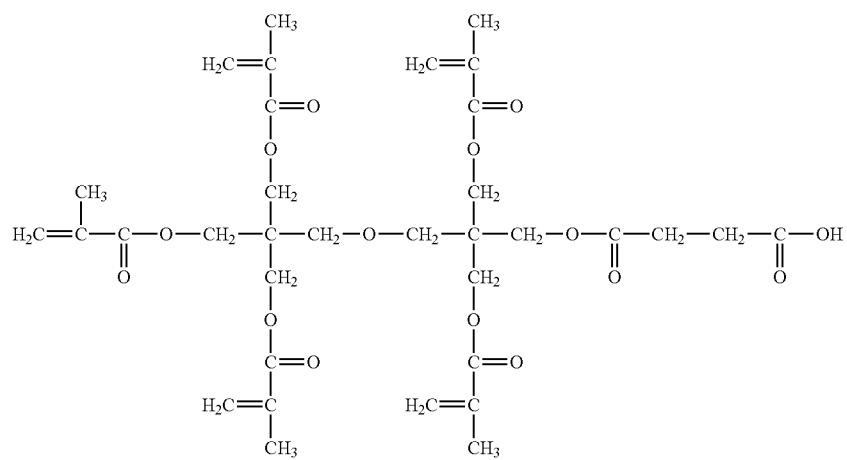
(M-8)

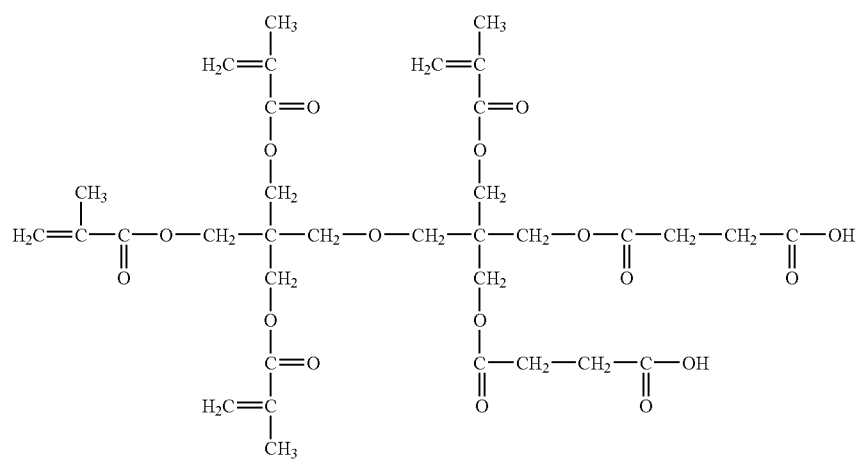
(M-9)
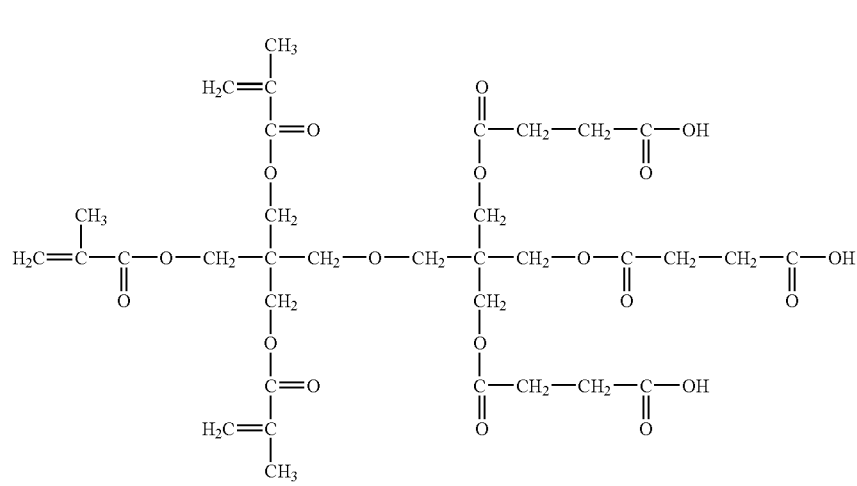
(M-10)
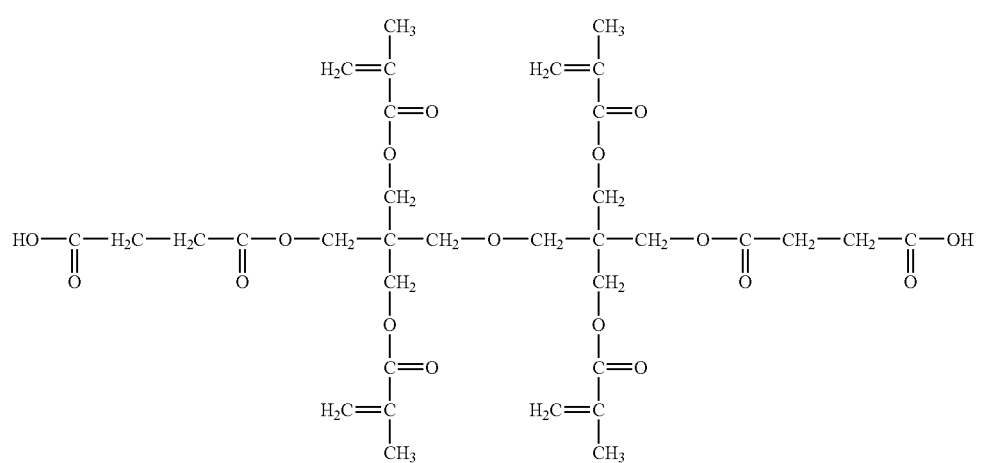
(M-11)

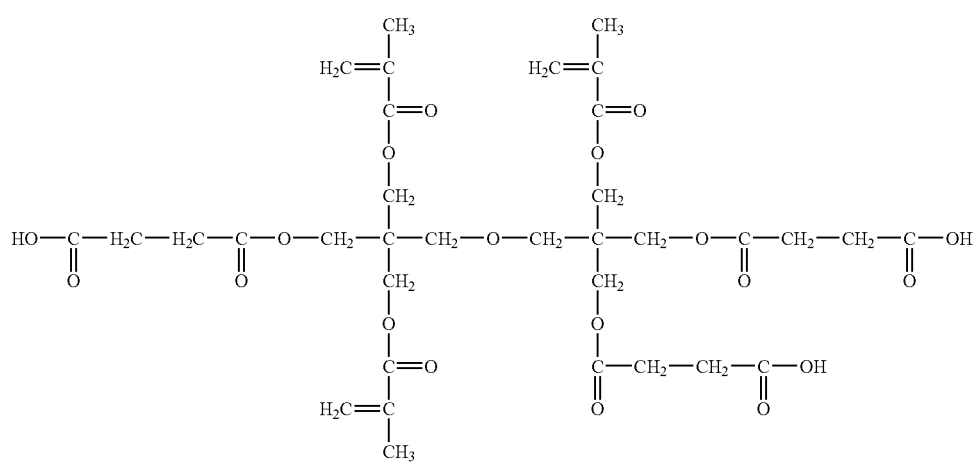
(M-12)

Among those above, specific examples of preferable combination of the acidic group-containing monomer and other radical polymeric monomer include a combination of TO-2359, TO-2360, TO-2348 or TO-2349 manufactured by TOAGOSEI CO., LTD. and the above-mentioned other radical polymeric monomer. The combination of the acidic group-containing monomer and other radical polymeric monomer is more preferably a combination of TO-2359, TO-2360, TO-2348 or TO-2349 manufactured by TOAGOSEI CO., LTD. and a urethane-polyfunctional monomer, and particularly preferably a combination of TO-2348 or TO-2349 manufactured by TOAGOSEI CO., LTD. and UA-7200 (urethane(meth)acrylate) manufactured by Shinnakamura Chemical Co., LTD.).

The acid value with respect to the total amount (total content) of the monomer is preferably 25 mg KOH/g or more from the viewpoint of suppressing the generation of a residue at a non-exposed portion. Among them, the above-mentioned acid value is preferably 25 mg KOH/g to 200 mg KOH/g, more preferably 30 mg KOH/g to 100 mg KOH/g, and further preferably 50 mg KOH/g to 100 mg KOH/g, from the viewpoint as mentioned above.

The acid value is measured by an ordinary method, for example, measured by titration using a burette, or by a potentiometric automated measuring machine (trade name: AT-310, manufactured by KYOTO ELECTRONICS MANUFACTURING CO., LTD.).

The content of the above-mentioned acidic group-containing monomer in the green curable composition is preferably 3.0% by mass or more with respect to the total mass of the composition, within a range in which the above acid value is satisfied, from the viewpoint of suppressing generation of a residue at a non-exposed portion. The content is more preferably 4.0% by mass or more, and most preferably 5.0% by mass or more, from the viewpoint as mentioned above.

<Photopolymerization Initiator>

The green curable composition of the invention preferably contains at least one kind of a photopolymerization initiator.

The photopolymerization initiator is a compound that decomposes by light to initiate and promote polymerization of a compound containing an ethylenic unsaturated bond. The photopolymerization initiator preferably has an absorption in a wavelength region of 300 to 500 nm. The photopolymerization initiator may be used alone or in combination of two or more kinds.

Examples of the photopolymerization initiator include organic halogenated compounds, oxadiazole compounds, carbonyl compounds, ketal compounds, benzoin compounds, acridine compounds, organic peroxide compounds, azo compounds, coumarin compounds, azido compounds, metallocene compounds, hexaaryl biimidazole compounds, organic boric acid compounds, disulfonic acid compounds, oxime ester compounds, onium salt compounds, and acyl phosphine (oxide) compounds.

Examples of the organic halogenated compounds specifically include the compounds described in Wakabayashi et al., Bull Chem. Soc Japan, 42, 2924 (1969), U.S. Pat. No. 3,905, 815, JP-B No. 46-4605, JP-A No. 48-36281, 55-32070, 60-239736, 61-169835, 61-169837, 62-58241, 62-212401, 63-70243 and 63-298339, M. P. Hutt, Journal of Heterocyclic Chemistry, 1 (No. 3), (1970), particularly oxazole compounds and s-triazine compounds substituted by a trihalomethyl group.

Examples of the s-triazine compounds include s-triazine derivatives in which at least one methyl group substituted by one, two or three halogen atoms is bonded to a s-triazine ring, specifically, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

Examples of the oxadiazole compounds include 2-trichloromethyl-5-styryl-1,3,4-oxadiazole, 2-trichloromethyl-5-(cyanostyryl)-1,3,4-oxadiazole, 2-trichloromethyl-5-

(naphth-1-yl)-1,3,4-oxadiazole, 2-trichloromethyl-5-(4-styryl)styryl-1,3,4-oxadiazole, and the like.

Examples of the carbonyl compounds include benzophenone derivatives such as benzophenone, Michler's ketone, 2-methyl benzophenone, 3-methyl benzophenone, 4-methyl benzophenone, 2-chloro benzophenone, 4-bromo benzophenone and 2-carboxy benzophenone; acetophenone derivatives such as 2,2-dimethoxy-2-phenyl acetophenone, 2,2-diethoxy acetophenone, 1-hydroxycyclohexylphenyl ketone, α-hydroxy-2-methylphenyl propanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl) ketone and 2-benzyl-2-dimethylamino-4-morpholino butyrophenone; thioxanthone derivatives such as thioxanthone, 2-ethyl thioxanthone, 2-isopropyl thioxanthone, 2-chloro thioxanthone, 2,4-dimethyl thioxanthone, 2,4-diethyl thioxanthone and 2,4-diisopropyl thioxanthone; benzoic acid ester derivatives such as p-dimethylamino ethyl benzoate and p-diethylamino ethyl benzoate; and the like.

Examples of the ketal compounds include benzylmethyl ketal, benzyl-β-methoxyethylethyl acetal, and the like.

Examples of the benzoin compounds include m-benzoin isopropyl ether, benzoin isobutyl ether, benzoin methyl ether, methyl o-benzoyl benzoate, and the like.

Examples of the acridine compounds include 9-phenyl acridine, 1,7-bis(9-acridinyl)heptane, and the like.

Examples of the organic peroxide compounds include trimethyl cyclohexanone peroxide, acetyl acetone peroxide, 1,1-bis(tert-butyl peroxy)-3,3,5-trimethyl cyclohexane, 1,1-bis(tert-butyl peroxy)cyclohexane, 2,2-bis(tert-butyl peroxy) butane, tert-butyl hydroperoxide, cumene hydroperoxide, diisopropyl benzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butyl peroxy)hexane, 2,5-oxanoyl peroxide, succinic acid peroxide, benzoyl peroxide, 2,4-dichlorobenzoyl peroxide, diisopropyl peroxy dicarbonate, di-2-ethylhexyl peroxy dicarbonate, di-2-ethoxyethyl peroxy dicarbonate, dimethoxy isopropyl peroxy carbonate, di(3-methyl-3-methoxybutyl)peroxy dicarbonate, tert-butyl peroxy acetate, tert-butyl peroxy pivalate, tert-butyl peroxy neodecanoate, tert-butyl peroxy octanoate, tert-butyl peroxy laurate, tertiary carbonate, 3,3',4,4'-tetra-(t-butyl peroxy carbonyl) benzophenone, 3,3',4,4'-tetra-(t-hexyl peroxy carbonyl)benzophenone, 3,3',4,4'-tetra-(p-isopropylcumyl peroxy carbonyl)benzophenone, carbonyl di(t-butyl peroxy dihydrogen diphthalate), carbonyl di(t-hexyl peroxy dihydrogen diphthalate), and the like.

Examples of the azo compounds include those described in JP-A No. 8-108621.

Examples of the coumarin compounds include 3-methyl-5-amino-((s-triazin-2-yl)amino)-3-phenyl coumarin, 3-chloro-5-diethylamino-((s-triazin-2-yl)amino)-3-phenyl coumarin, 3-butyl-5-dimethylamino-((s-triazin-2-yl)amino)-3-phenyl coumarin, and the like.

Examples of the azido compounds include organic azido compounds described in the specifications of U.S. Pat. Nos. 2,848,328, 2,852,379 and 2,940,853, 2,6-bis(4-azido benzylidene)-4-ethyl cyclohexanone (BAC-E), and the like.

Examples of the metallocene compounds include the titanocene compounds described in JP-A Nos. 59-152396, 61-151197, 63-41484, 2-249, 2-4705 and 5-83588, for example, di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl and di-methylcyclopentadienyl-Ti-bis-2,3,4,5,6-pentafluorophen-1-yl; the iron-arene complexes described in JP-A Nos. 1-304453 and 1-152109, and the like.

Examples of the hexaaryl biimidazole compounds include those described in JP-B No. 6-29285, U.S. Pat. Nos. 3,479,185, 4,311,783 and 4,622,286, or the like, specifically, 2,2'-bis(o-chlorophenyl)-4,4',5,5'-tetraphenyl biimidazole, 2,2'-bis(o-bromophenyl)4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, 2,2'-bis(o-trifluorophenyl)-4,4',5,5'-tetraphenyl biimidazole, and the like.

Examples of the organic boric acid salt compounds include organic boric acid salts described in, for example, JP-A Nos. 62-143044, 62-150242, 9-188685, 9-188686, 9-188710, 2000-131837 and 2002-107916, Japanese Patent No. 2764769, JP-A No. 2002-116539, and Martin Kunz, Rad Tech '98. Proceeding Apr. 19-22, 1998, Chicago; organoboron sulfonium complexes or organoboron oxosulfonium complexes described in JP-A Nos. 6-157623, 6-175564 and 6-175561; organoboron iodonium complexes described in JP-A Nos. 6-175554 and 6-175553; organoboron phosphonium complexes described in JP-A No. 9-188710; organoboron transition metal coordination complexes described in JP-A Nos. 6-348011, 7-128785, 7-140589, 7-306527 and 7-292014; and the like.

Examples of the disulfone compounds include compounds described in JP-A Nos. 61-166544 and 2002-328465, and the like.

Examples of the oxime ester compounds include those described in J. C. S. Perkin II (1979), pp. 1653-1660, J. C. S. Perkin II (1979), pp. 156-162, Journal of Photopolymer Science and Technology (1995), pp. 202-232 and JP-A Nos. 2000-66385 and 2000-80068, Japanese National Phase Publication No. 2004-534797, and the like.

Examples of the onium salt compounds include diazonium salts described in S. I. Schlesinger, Photogr. Sci. Eng., 18, 387, (1974) and T. S. Bal, et al., Polymer, 21, 423 (1980); ammonium salts described in U.S. Pat. No. 4,069,055 and JP-A No. 4-365049; phosphonium salts described in U.S. Pat. Nos. 4,069,055 and 4,069,056; and iodonium salts described in European Patent No. 104,143, U.S. Pat. Nos. 339,049 and 410,201, and JP-A Nos. 2-150848 and 2-296514.

The iodonium salts that can be favorably used in the invention is a diaryl iodonium salt, which is preferably substituted by at least two electron-donating groups such as an alkyl, alkoxy or aryloxy group, from the viewpoint of stability.

Examples of the sulfonium salt that can be favorably used in the present invention include those described in European Patent Nos. 370,693, 390,214, 233,567, 297,443 and 297,442, U.S. Pat. Nos. 4,933,377, 161,811, 410,201, 339,049, 4,760,013, 4,734,444 and 2,833,827, German Patent Nos. 2,904,626, 3,604,580 and 3,604,581. The sulfonium salt is preferably substituted by an electron-attracting group from the viewpoint of stability. The electron-attracting group preferably has a Hammett value of larger than 0. Preferable examples of the electron-attracting groups include a halogen atom and a carboxylic acid group.

Other preferable sulfonium salts include triaryl sulfonium salts that are substituted by a group having the structure of coumarin or anthoquinone, and have an absorption at a wavelength of 300 nm or more. Other preferable sulfonium salts include triaryl sulfonium salts that are substituted by an aryloxy or arylthio group and have an absorption at a wavelength of 300 nm or more.

Examples of the onium salt compounds include the selenonium salts described in J. V. Crivello et al., Macromolecules, 10(6), 1307 (1977), J. V. Crivello et al., J. Polymer Sci., Polymer Chem. Ed., 17, 1047 (1979); and arsonium salts described in C. S. Wen et al., Teh, Proc. Conf. Rad. Curing, ASIA, p. 478, Tokyo, October (1988).

Examples of acyl phosphine (oxide) compounds include IRGACURE 819, DALOCURE 4265 and DALOCURE TPO (trade name, manufactured by Ciba Japan K. K.).

From the viewpoint of exposure sensitivity, the photopolymerization initiator used in the present invention is preferably a compound selected from a group consisting of trihalomethyl triazine-based compounds, benzyldimethyl ketal compounds, α-hydroxy ketone compounds, α-amino ketone compounds, acyl phosphine-based compounds, phosphine oxide-based compounds, metallocene compounds, oxime-based compounds, biimidazole-based compounds, onium-based compounds, benzothiazole-based compounds, benzophenone-based compounds, acetophenone-based compounds, derivatives thereof, cyclopentadiene-benzene-iron complexes and salts thereof, halomethyl oxadiazole compounds, and 3-aryl substituted coumarin compounds.

The photopolymerization initiator is more preferably trihalomethyl triazine-based compounds, α-amino ketone compounds, acyl phosphine-based compounds, phosphine oxide-based compounds, oxime-based compounds, biimidazole-based compounds, onium-based compounds, benzophenone-based compounds and acetophenone-based compounds, and further preferably at least one kind of compounds selected from a group consisting of trihalomethyl triazine-based compounds, α-amino ketone compounds, oxime-based compounds, biimidazole-based compounds and benzophenone-based compounds.

In addition, the photopolymerization initiator is most preferably the oxime-based compounds such as the above-described oxime ester compounds (i.e., oxime-based photopolymerization initiators), from the viewpoint of further suppressing generation of a development residue.

Other examples of the oxime-based photopolymerization initiators include the oxime-based compounds described in JP-A No. 2000-80068, WO-02/100903A1, JP-A No. 2001-233842, and the like. The following are specific examples of the other oxime-based compounds, but the invention is not limited thereto.

2-(O-benzoyl oxime)-1-[4-(phenylthio)phenyl]-1,2-butanedione,
2-(O-benzoyl oxime)-1-[4-(phenylthio)phenyl]-1,2-pentanedione,
2-(O-benzoyl oxime)-1-[4-(phenylthio)phenyl]-1,2-hexanedione,
2-(O-benzoyl oxime)-1-[4-(phenylthio)phenyl]-1,2-heptanedione,
2-(O-benzoyl oxime)-1-[4-(phenylthio)phenyl]-1,2-octanedione,
2-(O-benzoyl oxime)-1-[4-(methylphenylthio)phenyl]-1,2-butanedione,
2-(O-benzoyl oxime)-1-[4-(ethylphenylthio)phenyl]-1,2-butanedione,
2-(O-benzoyl oxime)-1-[4-(butylphenylthio)phenyl]-1,2-butanedione,
1-(O-acetyl oxime)-1-[9-ethyl-6-(2-methylbenzoyl)-9H-carbazol-3-yl]ethanone,
1-(O-acetyl oxime)-1-[9-methyl-6-(2-methylbenzoyl)-9H-carbazol-3-yl]ethanone,
1-(O-acetyl oxime)-1-[9-propyl-6-(2-methylbenzoyl)-9H-carbazol-3-yl]ethanone,
1-(O-acetyl oxime)-1-[9-ethyl-6-(2-ethylbenzoyl)-9H-carbazol-3-yl]ethanone,
1-(O-acetyl oxime)-1-[9-ethyl-6-(2-butylbenzoyl)-9H-carbazole-3-yl]ethanone, and the like.

Among them, the oxime-based photopolymerization initiator is most preferably 2-(O-benzoyl oxime)-1-[4-(phenylthio)phenyl]-1,2-octanedione or 1-(O-acetyl oxime)-1-[9-ethyl-6-(2-methylbenzoyl)-9H-carbazol-3-yl] ethanone. Such oxime-based photopolymerization initiator includes CGI-124 and CGI-242 (trade name, manufactured by Ciba Japan K. K.).

The content of the photopolymerization initiator contained in the green curable composition of the invention is preferably 0.1 to 50% by mass, more preferably 0.5 to 30% by mass and further preferably 1 to 20% by mass with respect to the total solid content of the green curable composition. When the content is within the above range, good sensitivity and pattern forming properties may be obtained.

<Sensitizer>

A sensitizer may be contained in the green curable composition of the invention in order to improve radical generation efficiency of a radical initiator, and to achieve a longer photosensitive wavelength. The sensitizer that may be used in the invention is preferably those that sensitizes the above-described photopolymerization initiator by way of an electron transfer mechanism or energy transfer mechanism.

Examples of the sensitizer that may be used in the invention include the compounds as listed below which have an absorption wavelength in a wavelength region of 300 nm to 450 nm. Preferable examples of the sensitizers include the compounds as listed below which have an absorption wavelength in a wavelength region of 330 nm to 450 nm.

Polynuclear aromatics (for example, phenanthrene, anthracene, pyrene, perylene, triphenylene, 9,10-dialkoxy anthracene), xanthenes (for example, flourescein, eosin, erythrosine, rhodamine B, rose bengal), thioxanthones (isopropyl thioxanthone, diethyl thioxanthone, chloro thioxanthone), cyanines (for example, thiacarbocyanine, oxacarbocyanine), merocyanines (for example, merocyanine, carbomerocyanine), phthalocyanines, thiazines (for example, thionine, methylene blue, toluidine blue), acridines (for example, acridine orange, chloroflavin, acriflavin), anthraquinones (for example, anthraquinone), squaryliums (for example, squarylium), acridine orange, coumarins (for example, 7-diethylamino-4-methyl coumarin), ketocoumarin, phenothiazines, phenazines, styryl benzenes, azo compounds, diphenyl methane, triphenyl methane, distyryl benzenes, carbazoles, porphyrin compounds, spiro compounds, quinacridone compounds, indigo, styryl compounds, pyrylium compounds, pyrometene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, heterocyclic compounds such as N-aryl oxazolidinone, and the like.

Other examples includes the compounds described in, for example, in European Patent No. 568,993, U.S. Pat. Nos. 4,508,811 and 5,227,227, and JP-A Nos. 2001-125255 and 11-271969.

More preferable examples of the sensitizer include the compounds represented by the following Formulae (I) to (IV).

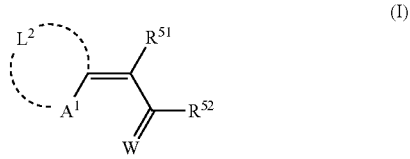
(I)

In Formula (I), $A^1$ represents a sulfur atom or $NR^{50}$, where $R^{50}$ represents an alkyl group or an aryl group; $L^2$ represents a non-metal atomic group that forms a basic nucleus of the pigment together with the adjacent $A^1$ and an adjacent carbon atom; $R^{51}$ and $R^{52}$ each independently represent a hydrogen atom or a monovalent non-metal atomic group, where $R^{51}$ and $R^{52}$ may bond to each other to form an acidic nucleus of the pigment; and W represents an oxygen atom or a sulfur atom.

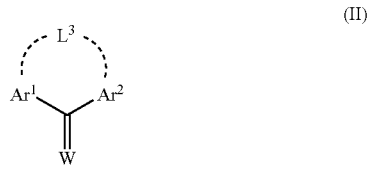
(II)

In Formula (II), $Ar^1$ and $Ar^2$ each independently represent an aryl group. $Ar^1$ and $Ar^2$ are linked via a bond $-L^3-$, which represents —O— or —S—. W has the same definition as W in Formula (I).

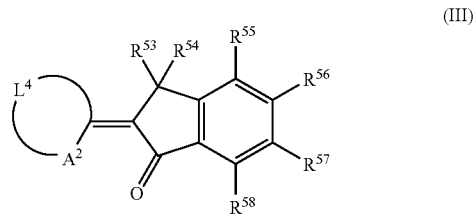
(III)

In Formula (III), $A^2$ represents a sulfur atom or $NR^{59}$; $L^4$ represents a non-metal atomic group that forms a basic nucleus of the pigment together with the adjacent $A^2$ and an adjacent carbon atom; $R^{53}$, $R^{54}$, $R^{55}$, $R^{56}$, $R^{57}$ and $R^{58}$ each independently represent a monovalent non-metal atomic group; and $R^{59}$ represents an alkyl group or an aryl group.

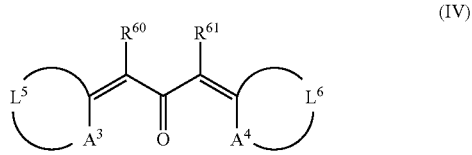
(IV)

In Formula (IV), $A^3$ and $A^4$ each independently represent —S—, —$NR^{62}$— or —$NR^{63}$—, where $R^{62}$ and $R^{63}$ each independently represent a substituted or non-substituted alkyl group or a substituted or non-substituted aryl group; $L^5$ and $L^6$ each independently represent a non-metal atomic group that forms a basic nucleus of the pigment together with the adjacent $A^3$ and $A^4$ and an adjacent carbon atom; and $R^{60}$ and $R^{61}$ each independently represent a monovalent non-metal atomic group, or may bond to each other to form an aliphatic or aromatic ring.

The sensitizer may be used alone or in combination of two or more kinds.

The content of the sensitizer in the green curable composition of the invention is preferably 0.1 to 20% by mass, and more preferably 0.5 to 15% by mass (by solid content) from the viewpoint of light absorption efficiency at a deep portion and initiation cleavage efficiency.

<Binder Polymer>

A binder polymer may be used in the green curable composition of the invention, in order to improve film properties or the like. The binder polymer is preferably a linear organic polymer.

<Co-Sensitizer>

A co-sensitizer may be preferably contained in the green curable composition of the invention. In the invention, the co-sensitizer has a function of further improving the sensitivity of the sensitized colorant or photopolymerization initiator with respect to active radiation rays, or suppressing the polymerization inhibition of a photopolymeric compound due to oxygen, or the like.

Examples of the co-sensitizer include amines, for example, the compounds described in M. R. Sander, et al., Journal of Polymer Society, Vol. 10, p. 3173 (1972), JP-B No. 44-20189, JP-A Nos. 51-82102, 52-134692, 59-138205, 60-84305, 62-18537 and 64-33104, Research Disclosure No. 33825,0 and the like, and specifically include triethanol amine, p-dimethylamino ethyl benzoate, p-formyldimethyl aniline, p-methylthiodimethyl aniline, and the like.

Other examples of the cosensitizer include thiols and sulfides, for example, the thiol compounds described in JP-A No. 53-702, JP-B No. 55-500806 and JP-A No. 5-142772, the disulfide compounds described in JP-A No. 56-75643 and the like, and specifically include 2-mercapto benzothiazole, 2-mercapto benzoxazole, 2-mercapto benzoimidazole, 2-mercapto-4(3H)-quinazoline, β-mercapto naphthalene, and the like.

Other examples of the cosensitizer include amino acid compounds (for example, N-phenyl glycine and the like), organic metal compounds described in JP-B No. 48-42965 (for example, tributyl tin acetate and the like), hydrogen donors described in JP-B No. 55-34414, sulfur compounds described in JP-A No. 6-308727 (for example, trithiane and the like), and the like.

The content of the co-sensitizer is preferably in the range of 0.1 to 30% by mass, more preferably in the range of 1 to 25% by mass, and further preferably in the range of 0.5 to 20% by mass with respect to the mass of the total solid content of the green curable composition, from the viewpoint of improving a curing rate based on the balance of polymerization growth rate and chain transfer.

<Polymerization Inhibitor>

In the present invention, it is preferable to add a small amount of heat polymerization inhibitor to inhibit unnecessary heat polymerization of the compounds having an ethylenic unsaturated double bond, which can cause polymerization reaction during production or storage of the green curable composition.

Examples of the heat polymerization inhibitors that may be used in the invention include hydroquinone, p-methoxy phenol, di-t-butyl-p-cresol, pyrogallol, t-butyl catechol, benzoquinone, 4,4'-thio bis(3-methyl-6-t-butyl phenol), 2,2'-methylene bis(4-methyl-6-t-butyl phenol), and a N-nitrosophenyl hydroxy amine cerium salt.

The amount of the heat polymerization inhibitor to be added is preferably from approximately 0.01% by mass to approximately 5% by mass with respect to the total mass of the composition. Furthermore, if necessary, a higher fatty acid derivative such as behenic acid or behenic acid amide may be added so as to be included in a surface portion of the photosensitive layer in an uneven manner, during the drying process after the coating process, in order to prevent polymerization inhibition caused by oxygen. The amount of the higher fatty acid derivative to be added is preferably approximately 0.5% by mass to approximately 10% by mass of the total composition.

<Other Additives>

Further, the green curable composition in the invention may further contain a known additive such as an inorganic filler or a plasticizer for the purpose of improving the physical properties of the cured film, a sensitizer that can improve the inking property of the photosensitive layer surface, or the like.

Examples of the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerin, and the like. If a binder is used, it may be added in 10% by mass or less with respect to the total mass of the compound having an ethylenic unsaturated double bond and the binder.

The green curable composition of the invention as mentioned above is cured with high sensitivity, and has favorable preservation stability as well. In addition, the green curable composition exhibits a high degree of adhesion to the surface of a hard material such as a substrate onto which the green curable composition is to be applied. Accordingly, the green curable composition of the invention may be suitably used in the fields of image forming materials for three-dimensional stereolithography, holography and color filters, inks, coating materials, adhesives, coating agents, and the like.

Color Filter and Method of Producing the Same

Hereinafter, the color filter of the invention and a method of producing the same will be explained.

The color filter of the invention includes a support, and a colored pattern formed by using the green curable composition of the invention on the support. Since the color filter of the invention is formed by using the green curable composition of the invention, it exhibits excellent spectroscopic characteristics and has a high resolving power.

Hereinafter, the color filter of the invention will be explained in detail through a method of producing the color filter of the invention.

The method of producing the color filter of the invention includes forming a curable composition layer by applying the green curable composition of the invention onto a support, exposing the curable composition layer to light through a mask, and developing the curable composition layer that has been exposed to light to form a colored pattern.

Hereinafter, each process of the method of producing the color filter of the invention will be explained.

<Formation of Curable Composition Layer>

In the method of the invention, the green curable composition of the invention is applied onto a support to form a green curable composition layer.

Examples of the support that may be used in the invention include a photoelectric conversion element substrate used in a solid-state image sensor or the like, such as a silicon substrate, complementary metal oxide film semiconductor (CMOS), and the like. The support may have a black stripe pattern that isolates each pixel from the other.

In addition, a basecoat layer may be formed on the support, if necessary, for the purpose of improving adhesion properties of the support to the upper layer, preventing diffusion of substances, or flattening the surface of the substrate.

The application of the green curable composition of the invention onto a support may be conducted by a known method such as slit application, inkjet application, rotation application, flow casting application, roll application, screen printing, or the like.

The thickness of the layer formed from the green curable composition is preferably 0.1 to 10 μm, more preferably 0.2 to 5 μm, and furthermore preferably 0.2 to 3 μm.

The drying (pre-baking) of the green curable composition layer that has been applied onto a support may be performed by, for example, using a hot plate, oven or the like, at a temperature of 50° C. to 140° C. for 10 to 300 seconds.

<Exposure>

The green curable composition layer that has been formed in the above process is exposed to light through a mask having a desired mask pattern.

The exposure may be performed by exposing the layer to light through a mask with a desired pattern, curing only an exposed portion of the layer, and developing it with a developer, to form a film having a pattern of respective colors (for example, 3 or 4 colors). The radiation rays that may be used in the exposure is preferably ultraviolet rays such as g-line rays or i-line rays. The radiation amount is preferably 5 to 1500 $mJ/cm^2$, more preferably 10 to 1000 $mJ/cm^2$, and most preferably 10 to 500 $mJ/cm^2$.

When the color filter of the invention is used for a liquid display device, the radiation amount is preferably 5 to 200 $mJ/cm^2$, more preferably 10 to 150 $mJ/cm^2$, and most preferably 10 to 100 $mJ/cm^2$. On the other hand, when the color filter of the invention is used for a solid-state image sensor, the radiation amount is preferably 30 to 1500 $mJ/cm^2$, more preferably 50 to 1000 $mJ/cm^2$, and most preferably 80 to 500 $mJ/cm^2$.

<Development>

Next, the green curable composition layer is subjected to alkali development to dissolve the non-exposed portion of the layer in an aqueous alkali solution, so that only the portion that has been cured by the exposure remains. The developer is desirably an organic alkali developer that does not damage the circuit or the like. The development temperature is usually 20° C. to 30° C., and the development time is usually 20 to 90 seconds.

Examples of the alkali agent that may be used in the developer include organic alkali compounds such as ammonia, ethyl amine, diethyl amine, dimethyl ethanol amine, tetramethyl ammonium hydroxide, tetraethyl ammonium hydroxide, choline, pyrrole, piperidine and 1,8-diazabicyclo-[5.4.0]-7-undecene. The developer is preferably prepared by dissolving the alkali agent as mentioned above in pure water to give a concentration of 0.001 to 10% by mass, preferably 0.01 to 1% by mass. When a developer containing an aqueous alkaline solution is used, rinsing with pure water is generally performed after the development.

Next, the colored pattern that has been developed is washed to remove residual developer and dried, and then subjected to heating treatment (post-baking). The aforementioned processes are conducted for a number of times corresponding to a predetermined number of colors, thereby obtaining a color filter.

The post-baking, which is a heating treatment that is performed after the development to ensure complete curing, is usually performed at a temperature of 100° C. to 240° C.

When the substrate is a glass substrate or a silicon substrate, the temperature is preferably in a range of 200° C. to 240° C.

The post-baking treatment may be performed to the layer that has been developed in a continuous process or in a batch process by using a heating means such as a hot plate, a convection oven (hot air-circulation type drying machine), or a high frequency-heater, under the aforementioned conditions.

As necessary, the method of the invention may include curing the colored pattern by heating and/or exposing to light, following the formation of the green curable composition layer, exposing the same to light, and developing the same, as described above.

Since the color filter for a solid-state image sensor of the invention is produced by using the above-mentioned green curable composition of the invention, the colored pattern exhibits high adhesion to a support substrate. In addition, since the composition that has been cured has excellent resistance to development, the obtained colored pattern exhibits excellent exposure sensitivity and favorable adhesion to the substrate at an exposed portion, and has a desired cross-section shape at high resolution. Accordingly, the green curable composition of the invention is suitably used for a color filter for a liquid display device or a solid-state image sensor such as CCDs and CMOSs, particularly suitably used for a solid-state image sensor such as CCDs and CMOSs having a resolution power of as high as more than a million pixels.

The color filter of the invention can be used, for example, as a color filter that is disposed between a light-receiving portion of each pixel and a micro lens for focusing light in a CCD.

The thickness of the colored pattern (colored pixel) in the above-mentioned color filter for a solid-state image sensor is preferably 2.0 μm or less, and more preferably 1.0 μm or less. The size (pattern width) of the colored pattern (colored pixel) is preferably 2.5 μm or less, more preferably 2.0 μm or less, and particularly preferably 1.7 μm or less.

The following are exemplary embodiments of the invention, but the invention is not limited thereto.

<1> A green curable composition comprising a colorant in an amount of 47.5% by mass or more with respect to the total solid content of the green curable composition, the colorant containing a halogenated copper phthalocyanine pigment and a barbituric acid derivative yellow pigment at a ratio of from 6/4 to 3/7 (halogenated copper phthalocyanine pigment/barbituric acid derivative yellow pigment).

<2> The green curable composition according to <1>, wherein the total amount of the halogenated copper phthalocyanine pigment and the barbituric acid derivative yellow pigment is from 80 to 100 mass % of the colorant.

<3> The green curable composition according to <1>, wherein a colored pattern formed from the composition has a transmittance of 7.5% or less in a wavelength region of 400 to 450 nm and a transmittance of 20.0% or less in a wavelength region of 630 to 650 nm, at a thickness of 1.0 μm.

<4> The green curable composition according to <3>, wherein the color pattern has a transmittance of 5.0% or less in a wavelength region of 400 to 450 nm and a transmittance of 15.0% or less in a wavelength region of 630 to 650 nm, at a thickness of 1.0 μm.

<5> The green curable composition according to <1>, further comprising a pigment-dispersing resin having an unsaturated double bond.

<6> The green curable composition according to <1>, further comprising an oxime photopolymerization initiator.

<7> A colored pattern formed from the green curable composition according to <1>.

<8> The colored pattern according to <7> having a thickness of 2.0 μm or less.

<9> The colored pattern according to <8> having a thickness of 1.0 μm or less.

<10> The colored pattern according to <7> having a pattern width of 2.5 μm or less.

<11> The colored pattern according to <10> having a pattern width of 2.0 μm or less.

<12> A color filter comprising a support and the colored pattern according to <7> formed on the support.

<13> A solid-state image sensor comprising the color filter according to <12>.

<14> A method of producing a color filter comprising:
forming a curable composition layer by applying the green curable composition according to <1> onto a support;
exposing the curable composition layer to light via a mask; and
forming a colored pattern by developing the curable composition layer that has been exposed to light.

EXAMPLES

Hereinafter, the invention will be further explained with reference to the following Examples. However, the invention is not limited to these Examples. In the following, the term "part" is based on mass unless otherwise stated.

Example 1

1-1. Preparation of Green Pigment Dispersion 30 parts of a mixture of C. I. Pigment Green 36 and C. I. Pigment Yellow 150 at a mass ratio of 55/45 (green/yellow) as a pigment, 16.6 parts of BYK 2001 (trade name, DISPER-BYK, manufactured by BYK-Chemie Japan, solid content concentration: 45.1% by mass) as a dispersing agent, 12.0 parts of a polymer having the aforementioned structure P-1 as a pigment-dispersing polymer, and 150.5 parts of propylene glycol monomethyl ether acetate as a solvent were mixed and dispersed by a bead mill for 15 hours, to prepare a Green pigment dispersion. The volume average particle size of the green pigment dispersion as measured by a dynamic light scattering method was 20 nm.

1-2. Preparation of Resist Solution for Basecoating

The following components were mixed and dissolved, to prepare a resist solution for basecoating.

| | |
|---|---|
| Propylene glycol monomethyl ether acetate (PGMEA) | 19.20 parts |
| Ethyl lactate | 36.67 parts |
| Resin (a 40% PGMEA solution of a benzyl methacrylate/methacrylic acid/2-hydroxyethyl methacrylate copolymer (molar ratio = 60:20:20)) | 30.51 parts |
| Polymerizable compound (trade name: KAYARAD DPHA, manufactured by NIPPON KAYAKU, CO. LTD.) | 12.20 parts |
| Polymerization inhibitor (p-methoxyphenol) | 0.0061 parts |
| Fluorine-based surfactant (trade name: F-475, manufactured by DIC Corporation) | 0.83 parts |
| Photopolymerization initiator (trade name: TAZ-107, trihalomethyl triazine-based photopolymerization initiator, manufactured by Midori Kayaku, Co., Ltd.) | 0.586 parts |

1-3. Manufacturing of Silicon Wager with Basecoat Layer

A 6-inch silicon wafer was subjected to a heat treatment at 200° C. for 30 minutes in an oven. Then, the above resist solution for basecoating was applied onto this silicon wafer to a dry thickness of 1 μm, and further heated for drying on a 200° C. hot plate for 5 minutes to form a basecoat layer, to produce a silicon wafer with a basecoat layer.

1-4. Preparation of Green Curable Composition (Application Solution) A-1

A green curable composition A-1 was prepared by mixing and stirring the following components.

| <Composition> | |
|---|---|
| Green pigment dispersion (prepared above) | 12.70 parts |
| Photopolymerization initiator (trade name: CGI-124, manufactured by Ciba Japan, K. K.) | 0.13 parts |
| Monomer 1: Compound M-2 (acidic group-containing monomer, acid value: 89.8 mg KOH/g) | 0.21 parts |
| Monomer 2: Dipentaerythritol hexacrylate | 0.09 parts |
| Alkali-soluble resin (copolymerization ratio [Molar ratio] = 60/20/20, weight-average molecular weight = about 14,000) | 0.38 parts |
| p-methoxy phenol | 0.0001 parts |
| Solvent (propylene glycol monomethyl ether acetate (PGMEA) | 7.02 parts |
| Surfactant (a 1.0% PGMEA solution, trade name: F-781, manufactured by DIC Corporation) | 5.23 parts |

1-5. Application, Exposure and Development of Green Curable Composition

Green curable composition A-1 prepared in the above process 1-4 was applied onto the basecoat layer that has been formed on the silicon wafer in the above process 1-3, to form a photo-curable film. Then, this film was subjected to a heat treatment (pre-baking) to a dry thickness of 0.7 μm using a 100° C. hot plate for 120 seconds. Then, the film was exposed to light having a wavelength of 365 nm at an exposure amount of from 100 to 2500 mJ/cm² (by changing the exposure amount by 50 mJ/cm²), through a mask having a Bayer pattern of 1.2 μm square, using an i-line stepper exposure device (trade name: FPA-3000i5+, manufactured by Canon Inc.). Thereafter, the silicon wafer with the film that has been exposed was placed on a horizontal rotation table of a spin shower development machine (type: DW-30, manufactured by Chemitronics Co., Ltd.), and subjected to paddle development using a 50% diluted solution of CD-2000 (manufactured by FUJIFILM Electronic Materials Co., Ltd.) at 23° C. for 60 seconds, to form a colored pattern on the silicon wafer.

The silicon wafer on which the colored pattern had been formed was fixed to the above-mentioned horizontal rotation table in a vacuum chuck method. Then, the silicon wafer was subjected to a rinse treatment by showering with pure water from an exhaust nozzle above the rotation center, while being rotated by a rotation device at a rotation rate of 50 rpm, and was then spray-dried. The silicon wafer was then heated on a 200° C. hot plate for 5 minutes, to produce a color filter having a green pattern.

Evaluation

The color filter obtained above was evaluated in accordance with the following criteria. The evaluation results are shown in Table 1 below.

(1) Evaluation of Residue

The pattern was observed by a scanning electron microscope (SEM) at a 20,000-fold magnification, and a residue at a non-exposed portion (development properties) was evaluated in accordance with the following criteria.

<Evaluation Criteria>

A: The non-exposed portion is totally removed.

B: A residue is slightly observed, but within an acceptable range.

C: A residue is observed, but within a practically acceptable range.

D: A residue is distinctly observed, which is out of an acceptable range.

E: A residue is significantly observed.

(2) Evaluation of Pattern Rectangularity

The cross-section of the pattern was observed using a scanning electron microscope (SEM) at a 20,000-fold magnification, and the rectangularity of the pattern was evaluated based on the following criteria.

<Evaluation Criteria>

A: The rectangularity of the pattern is excellent.

B: The rectangularity of the pattern is within an acceptable range.

C: The rectangularity of the pattern is inferior, but within a practically acceptable range.

D: The rectangularity of the pattern is poor and out of an acceptable range.

E: The rectangularity of the pattern is significantly inferior.

(3) Spectroscopic Characteristics

The green curable composition was applied onto a glass substrate to a thickness of 1.0 μm, and was heated on a 100° C. hot plate for 120 seconds. There after, the dispersion of green curable composition was measured by a spectrometer (trade name: MCPD-3000, manufactured by OTSUKA ELECTRONICS CO., LTD.), and the transmittance at a wavelength region of 400 to 450 nm ($T_{400\text{-}450\ nm}$) and the transmittance at a wavelength region of 630 to 650 nm ($T_{630\text{-}650\ nm}$) were measured and evaluated based on the following evaluation criteria.

<Evaluation Criteria>

A: $T_{400\text{-}450\ nm}$ is 5.0% or less, and $T_{630\text{-}650\ nm}$ is 15.0% or less.

B: $T_{400\text{-}450\ nm}$ is 7.5% or less, and $T_{630\text{-}650\ nm}$ is 20.0% or less.

C: $T_{400\text{-}450\ nm}$ is more than 7.5%, or $T_{630\text{-}650\ nm}$ is more than 20.0%.

D: $T_{400\text{-}450\ nm}$ is more than 7.5%, and $T_{630\text{-}650\ nm}$ is more than 20.0%.

Examples 2 to 15 and Comparative Examples 1 to 5

A color filter was produced and evaluated in a similar manner to Example 1, except that the type and ratio of the pigments, the type of the pigment-dispersing resin, the type and amount of the monomers, and the type and ratio of the initiator were changed as shown in the following Table 1. The evaluation results are shown in the following Table 2.

TABLE 1

| | Resist composition | | | | | | | |
|---|---|---|---|---|---|---|---|---|
| | Yellow pigment | Green/Yellow ratio | Pigment ratio (%) | Resin | Monomer 1 | Monomer 2 | Acid value | Initiator |
| Example 1 | Pigment Yellow 150 | 55/45 | 47.5 | P-1 | M-2 | DPHA | 62.9 | CGI-124 |
| Example 2 | Pigment Yellow 150 | 55/45 | 47.5 | P-1 | M-2 | UA-7200 | 62.9 | CGI-124 |
| Example 3 | Pigment Yellow 150 | 60/40 | 47.5 | P-2 | M-2 | DPHA | 62.9 | CGI-124 |
| Example 4 | Pigment Yellow 150 | 30/70 | 47.5 | P-2 | M-2 | DPHA | 62.9 | CGI-124 |
| Example 5 | Pigment Yellow 150 | 55/45 | 47.5 | P-6 | M-2 | DPHA | 62.9 | CGI-124 |
| Example 6 | Pigment Yellow 185 | 55/45 | 47.5 | P-1 | M-2 | DPHA | 62.9 | CGI-124 |
| Example 7 | Pigment Yellow 139 | 55/45 | 47.5 | P-1 | M-2 | DPHA | 62.9 | CGI-124 |
| Example 8 | Pigment Yellow 139 | 55/45 | 47.5 | P-1 | M-2 | DPHA | 62.9 | IRGACURE 369 |
| Example 9 | Pigment Yellow 150 | 55/45 | 47.5 | P-1 | M-2 | DPHA | 23.9 | CGI-124 |
| Example 10 | Pigment Yellow 150 | 55/45 | 47.5 | P-1 | M-3 | DPHA | 117 | CGI-124 |
| Example 11 | Pigment Yellow 150 | 55/45 | 47.5 | P-1 | M-2 | UA-7200 | 23.9 | CGI-124 |
| Example 12 | Pigment Yellow 150 | 55/45 | 47.5 | DPHA | M-2 | UA-7200 | 0 | CGI-124 |
| Example 13 | Pigment Yellow 150 | 55/45 | 50 | P-1 | M-2 | DPHA | 62.9 | CGI-124 |
| Example 14 | Pigment Yellow 150 | 55/45 | 55 | P-1 | M-2 | DPHA | 62.9 | CGI-124 |
| Example 15 | Pigment Yellow 150 | 55/45 | 60 | P-1 | M-2 | DPHA | 62.9 | CGI-124 |
| Comparative example 1 | Pigment Yellow 150 | 61/39 | 47.5 | P-1 | M-2 | DPHA | 62.9 | CGI-124 |
| Comparative example 2 | Pigment Yellow 150 | 29/71 | 47.5 | P-1 | M-2 | DPHA | 62.9 | CGI-124 |
| Comparative example 3 | Pigment Yellow 138 | 55/45 | 47.5 | P-1 | M-2 | DPHA | 62.9 | CGI-124 |
| Comparative example 4 | Pigment Yellow 185 | 55/45 | 47 | P-1 | M-2 | DPHA | 62.9 | CGI-124 |
| Comparative example 5 | Pigment Yellow 138 | 55/45 | 47 | P-1 | M-2 | DPHA | 62.9 | CGI-124 |

TABLE 2

| | Residue in non-exposed portion | Pattern rectangularity | Spectroscopic characteristics |
|---|---|---|---|
| Example 1 | A | A | A |
| Example 2 | A | A | A |
| Example 3 | B | A | A |
| Example 4 | A | C | B |
| Example 5 | A | B | B |
| Example 6 | A | B | B |
| Example 7 | A | B | B |
| Example 8 | B | B | B |
| Example 9 | C | A | A |
| Example 10 | A | B | A |
| Example 11 | B | A | A |
| Example 12 | B | A | A |
| Example 13 | A | A | A |
| Example 14 | B | B | A |
| Example 15 | C | C | A |
| Comparative example 1 | D | A | A |
| Comparative example 2 | A | E | B |
| Comparative example 3 | D | B | C |
| Comparative example 4 | A | C | C |
| Comparative example 5 | A | A | C |

In Table 1, DPHA is dipentaerythritol hexacrylate; IRGACURE 369 is aminoalkyl phenone-based photopolymerization initiator (manufactured by Ciba Japan, K. K.); UA-7200 is urethane(meth)acrylate (manufactured by Shin-nakamura Chemical Co., Ltd.); and P-6 is a compound represented by the structural formula below.

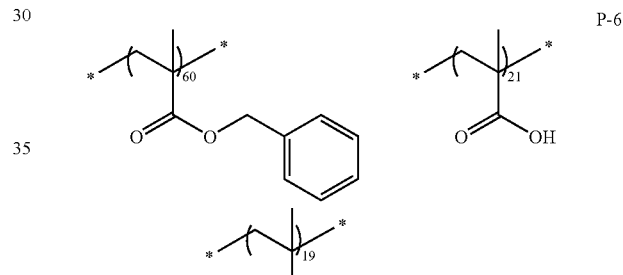

Mw: 14,000

Acid value: 79.3 mg KOH/g

As shown in Table 1, the colored pattern formed from the green curable composition of the invention (Examples 1 to 15) exhibited excellent spectroscopic characteristics and pattern rectangularity, and generated a suppressed amount of development residue.

In the above Examples, a green colored pattern was formed on a basecoat layer that had been formed on a silicon wafer. However, a color filter of three colors can be produced by forming a red colored pattern and a blue colored pattern on the basecoat layer prior to the formation of the green colored pattern. In this case, effects of the green colored pattern that are similar to those achieved in Example may also be achieved.

Further, by replacing the silicon wafer with a substrate for a solid-state image sensor having a light-receiving device such as a photo diode formed thereon, a solid-state image sensor with less noise and excellent color reproducibility can be produced.

All publications, patent applications, and technical standards mentioned in this specification are herein incorporated by reference to the same extent as if each individual publication, patent application, or technical standard was specifically and individually indicated to be incorporated by reference.

What is claimed is:

1. A green curable composition comprising
a colorant in an amount of 47.5% by mass or more with respect to the total solid content of the green curable composition, the colorant containing a halogenated copper phthalocyanine pigment and a barbituric acid derivative yellow pigment at a ratio of from 6/4 to 3/7 (halogenated copper phthalocyanine pigment/barbituric acid derivative yellow pigment),
an acidic group-containing monomer in an amount such that an acid value of the total content of the monomer is 25 mg KOH/g or more, and
a pigment-dispersing resin having a structure represented by any one of the following Formulae (1) to (3):

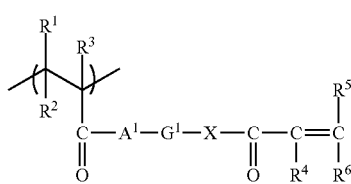

Formula (1)

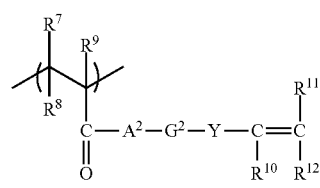

Formula (2)

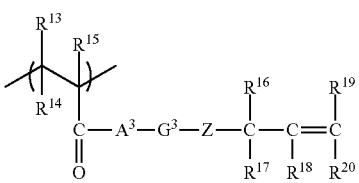

Formula (3)

wherein in Formulae (1) to (3), each of $A^1$, $A^2$ and $A^3$ independently represents an oxygen atom, a sulfur atom or $—N(R^{21})—$; $R^{21}$ represents an alkyl group that may have a substituent; $G^1$ represents a linear or branched alkylene group having 1 to 10 carbon atoms that may have a substituent, or an aromatic group having 6 to 12 carbon atoms that may have a substituent; each of $G^2$ and $G^3$ independently represents a bivalent organic group; each of X and Z independently represents an oxygen atom, a sulfur atom or $—N(R^{22})—$; $R^{22}$ represents an alkyl group that may have a substituent; Y represents an oxygen atom, a sulfur atom, a phenylene group that may have a substituent, or $—N(R^{23})—$; $R^{23}$ represents an alkyl group that may have a substituent; and each of $R^1$ to $R^{20}$ independently represents a hydrogen atom or a monovalent substituent.

2. The green curable composition according to claim 1, wherein the total amount of the halogenated copper phthalocyanine pigment and the barbituric acid derivative yellow pigment is from 80 to 100 mass % of the colorant.

3. The green curable composition according to claim 1, wherein a colored pattern formed from the composition has a transmittance of 7.5% or less in a wavelength region of 400 to 450 nm and a transmittance of 20.0% or less in a wavelength region of 630 to 650 nm, at a thickness of 1.0 μm.

4. The green curable composition according to claim 3, wherein the color pattern has a transmittance of 5.0% or less in a wavelength region of 400 to 450 nm and a transmittance of 15.0% or less in a wavelength region of 630 to 650 nm, at a thickness of 1.0 μm.

5. The green curable composition according to claim 1, further comprising an oxime photopolymerization initiator.

6. A colored pattern formed from the green curable composition according to claim 1.

7. The colored pattern according to claim 6 having a thickness of 2.0 μm or less.

8. The colored pattern according to claim 7 having a thickness of 1.0 μm or less.

9. The colored pattern according to claim 6 having a pattern width of 2.5 μm or less.

10. The colored pattern according to claim 9 having a pattern width of 2.0 μm or less.

11. A color filter comprising a support and the colored pattern according to claim 6 formed on the support.

12. A solid-state image sensor comprising the color filter according to claim 11.

13. A method of producing a color filter comprising: forming a curable composition layer by applying the green curable composition according to claim 1 onto a support; exposing the curable composition layer to light via a mask; and forming a colored pattern by developing the curable composition layer that has been exposed to light.

14. The green curable composition according to claim 1, wherein the acidic group-containing monomer comprises a polyfunctional acidic group-containing (meth)acrylic compound represented by the following Formula (III-1) or Formula (III-2):

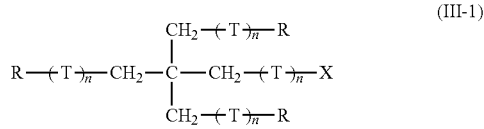

(III-1)

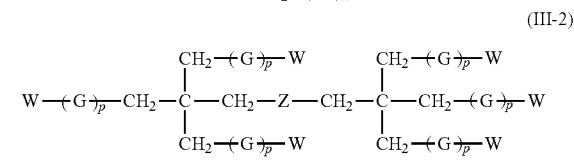

(III-2)

wherein R is selected from the group consisting of

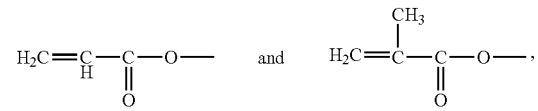

wherein X is selected from the group consisting of

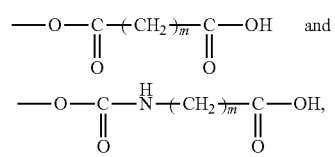

wherein T is selected from the group consisting of
$—CH_2—$, $—OCH_2—$, $—OCH_2CH_2—$, $—OCH_2CH_2CH_2—$, and $—OCH_2CH_2CH_2CH_2—$, wherein Z is selected from the group consisting of —O— and

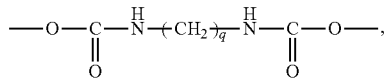

wherein G is selected from the group consisting of —CH$_2$—, —OCH$_2$—, —OCH$_2$CH$_2$—, —OCH$_2$CH$_2$CH$_2$—, and —OCH$_2$CH$_2$CH$_2$CH$_2$—, and wherein in formula (III-1) and formula (III-2), if T or G is an oxyalkylene group, the carbon atom-side end thereof is bonded to R, X and W; in Formula (III-1), n is 0 to 14, and m is 1 to 8; in Formula (III-2), W has the same definition as R or X in Formula (III-1), and at least three of W are R; p is 0 to 14; q is 1 to 8; and each of R, X, T and G within one molecule may be the same or different.

15. The green curable composition according to claim 14, wherein the polyfunctional acidic group-containing (meth) acrylic compound represented by Formula (III-1) or Formula (III-2) is any one of the following Formulae (M-1) to (M-12):

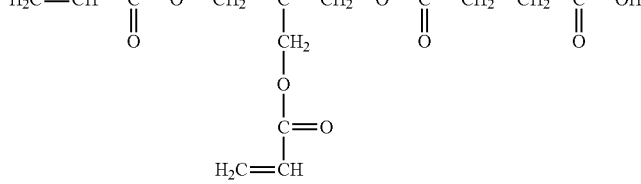
(M-1)

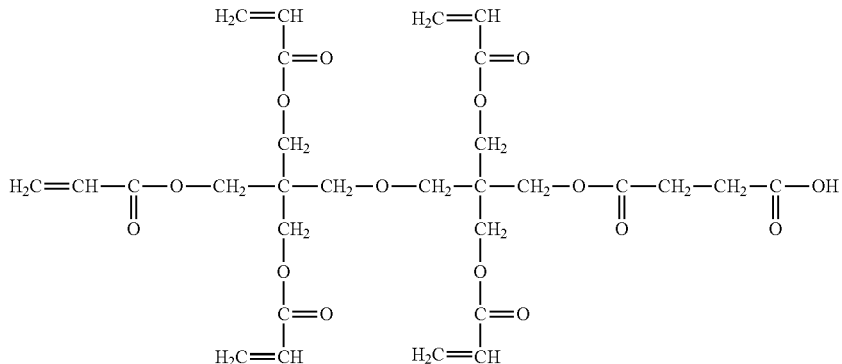
(M-2)

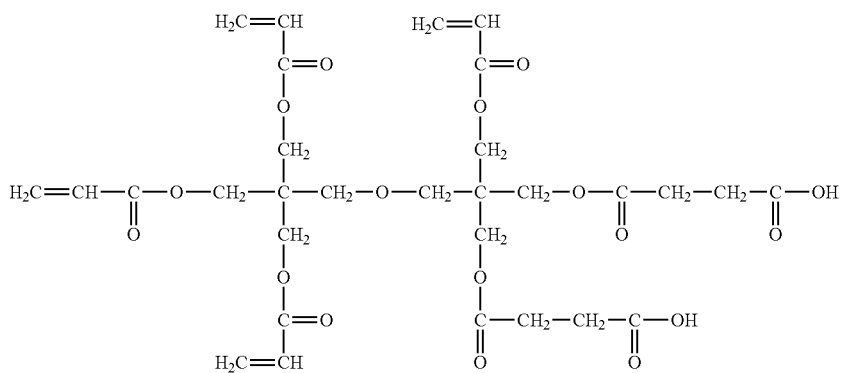
(M-3)

-continued
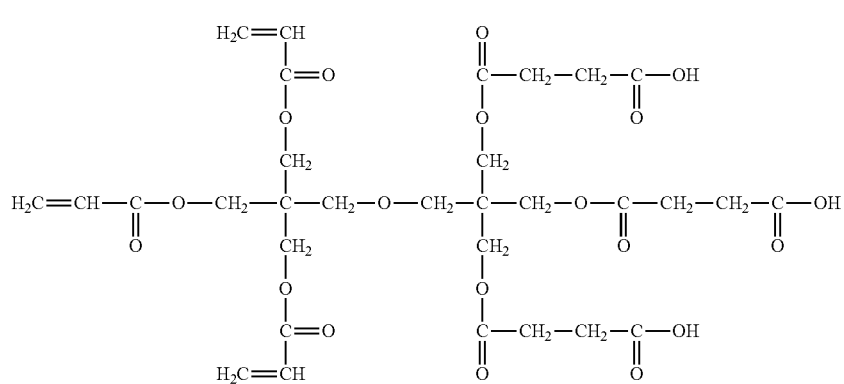
(M-4)
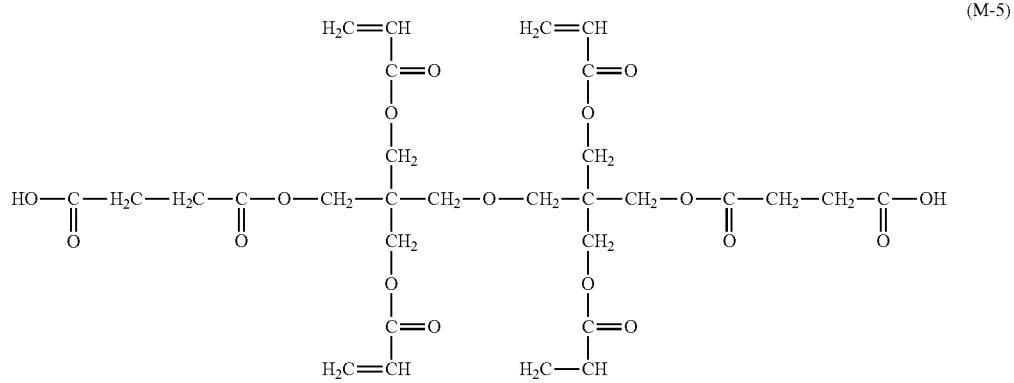
(M-5)
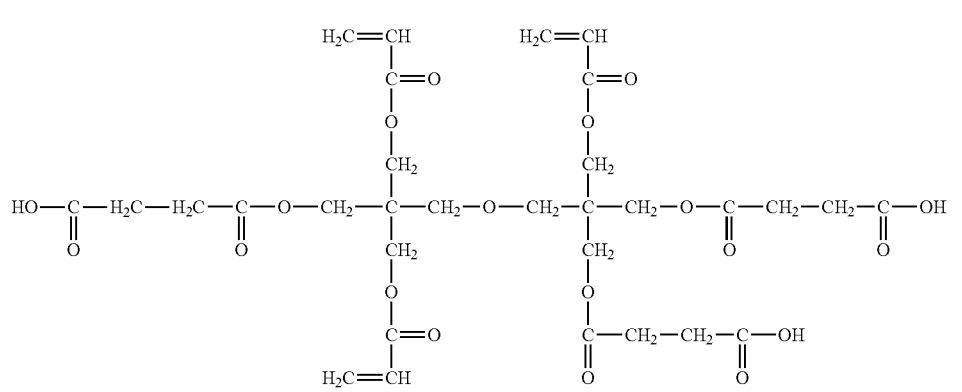
(M-6)
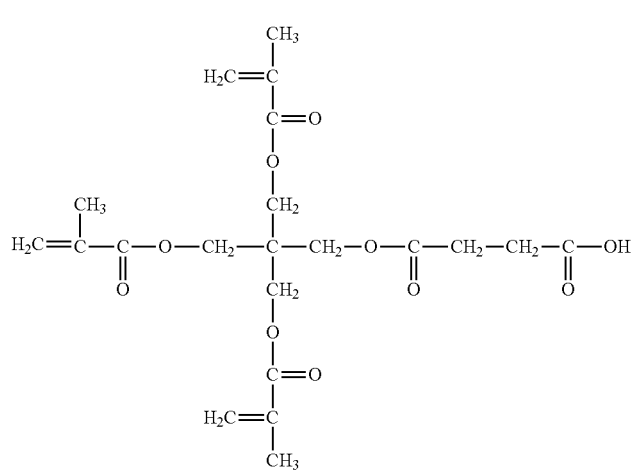
(M-7)

(M-8)
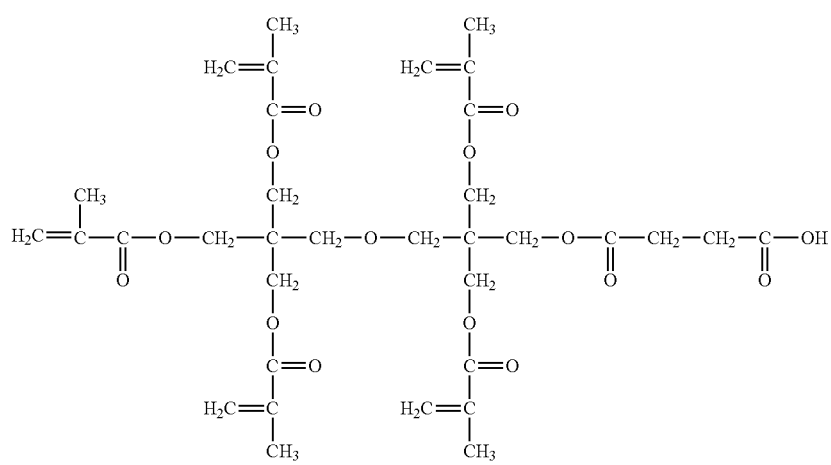
(M-9)
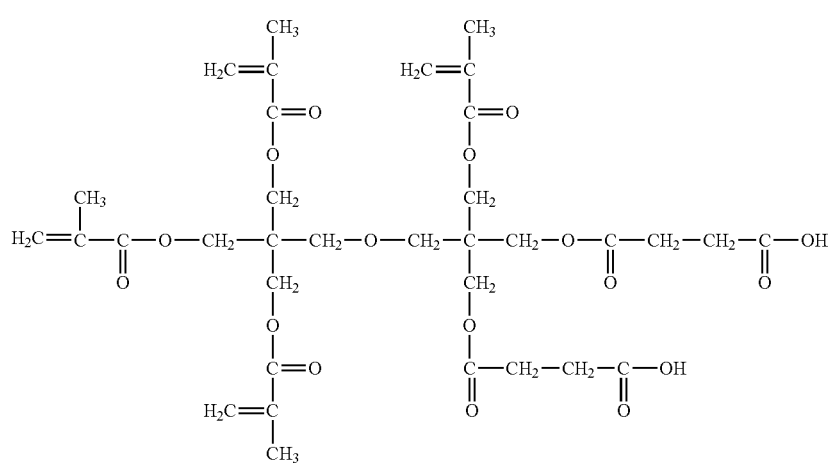
(M-10)
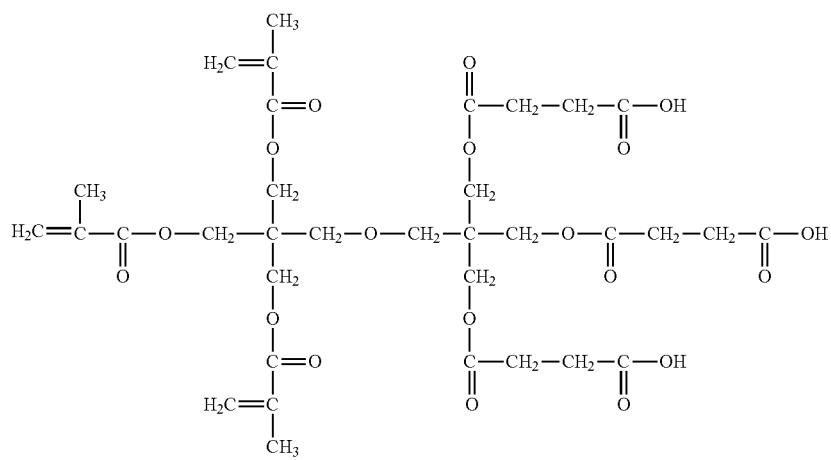

-continued

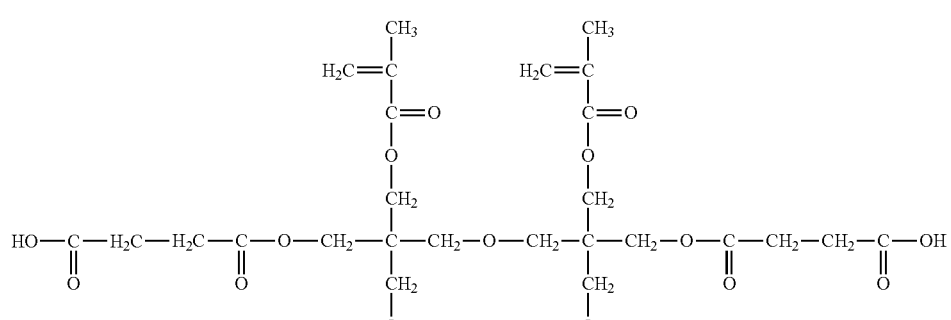

(M-11)

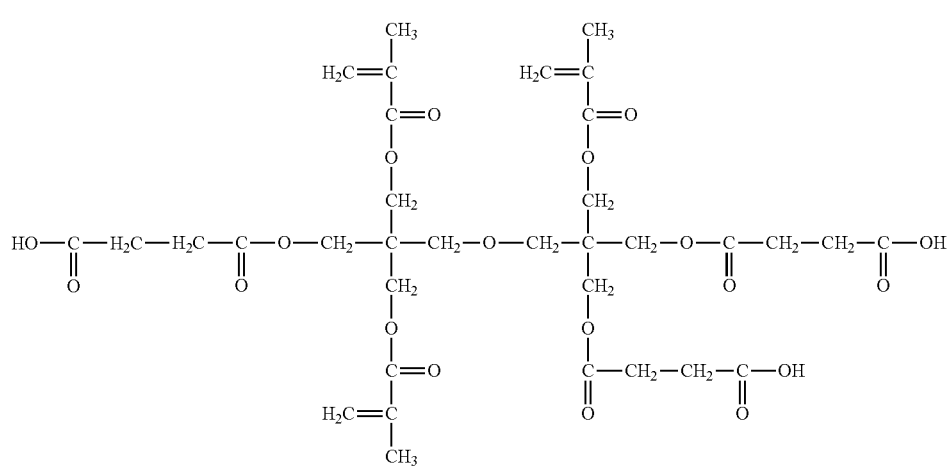

(M-12)

16. The green curable composition of claim 1, further comprising:
an oxime photopolymerization initiator represented by 2-(O-benzoyloxime)-1-[4-(phenylthio)phenyl]-1,2-octanedione.

17. The green curable composition of claim 1, further comprising
at least two kinds of monomers comprising an acidic group-containing monomer, wherein the acid value of the total content of the at least two kinds of monomers is from 50 mg KOH/g to 100 mg KOH/g.

18. The green curable composition according to claim 17, wherein the at least two kinds of monomers comprise a urethane-polyfunctional monomer.

* * * * *